(12) United States Patent
Lane et al.

(10) Patent No.: US 9,153,560 B2
(45) Date of Patent: Oct. 6, 2015

(54) PACKAGE ON PACKAGE (POP) INTEGRATED DEVICE COMPRISING A REDISTRIBUTION LAYER

(71) Applicant: QUALCOMM Incorporated, San Diego, CA (US)

(72) Inventors: Ryan David Lane, San Diego, CA (US); Charles David Paynter, Encinitas, CA (US); David Ian West, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/268,974

(22) Filed: May 2, 2014

(65) Prior Publication Data

US 2015/0206854 A1    Jul. 23, 2015

Related U.S. Application Data

(60) Provisional application No. 61/930,360, filed on Jan. 22, 2014.

(51) Int. Cl.
*H01L 23/34* (2006.01)
*H01L 25/065* (2006.01)
*H01L 23/528* (2006.01)

(52) U.S. Cl.
CPC .......... *H01L 25/0657* (2013.01); *H01L 23/528* (2013.01); *H01L 2225/06513* (2013.01); *H01L 2225/06517* (2013.01); *H01L 2225/06541* (2013.01); *H01L 2225/06548* (2013.01)

(58) Field of Classification Search
CPC . H01L 25/043; H01L 25/162; H01L 25/0657; H01L 23/528
USPC .................................................. 257/724, 777
See application file for complete search history.

(56) References Cited

U.S. PATENT DOCUMENTS

| 6,542,393 | B1 * | 4/2003 | Chu et al. ........................ 365/51 |
| 7,535,110 | B2 | 5/2009 | Wu et al. |
| 7,807,503 | B2 | 10/2010 | Doan |
| 8,125,055 | B2 | 2/2012 | Robinson |
| 2008/0105984 | A1 | 5/2008 | Lee |
| 2013/0062784 | A1 * | 3/2013 | Hong ............................ 257/777 |
| 2013/0320535 | A1 | 12/2013 | Tao et al. |

* cited by examiner

*Primary Examiner* — Tu-Tu Ho
(74) *Attorney, Agent, or Firm* — Loza & Loza, LLP

(57) ABSTRACT

Some features pertain to an integrated device that includes a first package, a set of interconnects, and a second package. The first package includes a first substrate comprising a first surface and a second surface. The first package includes a redistribution portion comprising a redistribution layer. The first package includes a first die coupled to the first surface of the first substrate. The set of interconnects is coupled to the redistribution portion of the first package. The second package is coupled to the first package through the set of interconnects. The second package includes a second substrate comprising a first surface and a second surface; and a second die coupled to the first surface of the second substrate, where the second die is electrically coupled to the first die through the second substrate of the second package, the set of interconnects, and the redistribution portion of the first package.

19 Claims, 23 Drawing Sheets

PACKAGE ON PACKAGE (POP) INTEGRATED DEVICE COMPRISING A REDISTRIBUTION LAYER

BACKGROUND

The present application claims priority to U.S. Provisional Application No. 61/930,360, entitled "Package on Package (PoP) Integrated Device Comprising a Redistribution Layer", filed Jan. 22, 2014, which is hereby expressly incorporated by reference herein.

FIELD

Various features relate to a package on package (PoP) integrated device comprising a redistribution layer.

BACKGROUND

FIG. 1 illustrates a conventional package on package (PoP) integrated device. As shown in FIG. 1, the integrated device 100 includes a first package 102 and a second package 104. The first package 102 includes a first substrate 106, a first die (e.g., chip) 108, a first set of solder balls 116, and a first set of interconnects 118. The first substrate 106 may include traces and/or vias (both of which are not shown). The second package 104 includes a second substrate 105, a second die 107, a third die 109, a second set of solder balls 115, a first set of wire bonding 117, and a second set of wire bonding 119. The second substrate 105 may include traces and/or vias (both of which are not shown). The second package 104 is positioned above the first package 102.

The first die 108 is coupled to a first surface (e.g., top surface) of the first substrate 106 through the first set of interconnects 118. The first set of solder balls 116 is coupled to a second surface (e.g., bottom surface) of the first substrate 106. The first substrate 106 includes a set of traces and/or vias that may electrically connect to the first die 108 and/or the first set of solder balls 116.

The second die 107 and the third die 109 are coupled to a first surface (e.g., top surface) of the second substrate 105. The second die 107 is electrically coupled to the traces and/or vias of the second substrate 105 through the first set of wire bonding 117. The third die 109 is electrically coupled to the traces and/or vias of the second substrate 105 through the second set of wire bonding 119. The second set of solder balls 115 is coupled to a second surface (e.g., bottom surface) of the second substrate 105.

One major drawback of the package on package (PoP) configuration shown in FIG. 1 is that it creates an integrated device with a form factor that may be too large for the needs of mobile computing devices. That is, the PoP configuration shown in FIG. 1 may be too thick and/or have a surface area that is too large to meet the needs and/or requirements of mobile computing devices.

Therefore, there is a need for an integrated device that includes an improved PoP configuration. Ideally, such an integrated device will have a better form factor (e.g., smaller, thinner) that meets the needs and/or requirements of mobile computing devices. Moreover, such an improved PoP configuration would provide better integrated device performance (e.g., better signal, better channel, better electrical speed performance).

SUMMARY

Various features, apparatus and methods described herein provide a package on package (PoP) integrated device comprising a redistribution layer.

A first example provides an integrated device that includes a first package, a set of interconnects, and a second package. The first package includes a first substrate comprising a first surface and a second surface. The first package includes a redistribution portion comprising a redistribution layer. The first package includes a first die coupled to the first surface of the first substrate. The set of interconnects is coupled to the redistribution portion of the first package. The second package is coupled to the first package through the set of interconnects. The second package includes (i) a second substrate comprising a first surface and a second surface; and (ii) a second die coupled to the first surface of the second substrate, where the second die is electrically coupled to the first die through the second substrate of the second package, the set of interconnects, and the redistribution portion of the first package.

According to an aspect, the second package further includes a third die coupled to the second surface of the second substrate. In some implementations, the third die is electrically coupled to the first die through at least the second substrate of the second package, the first set of interconnects, and the redistribution portion of the first package. In some implementations, the second die and the third die are electrically coupled to the first die through a first electrical path that includes a combined electrical signal from the second die and the third die. In some implementations, the second die is coupled to the first die through a second electrical path that provides a control signal from the first die to the second die.

According to one aspect, the second package further includes a third die that is stacked on the second die, where the second die includes through substrate vias (TSVs). In some implementations, the third die is electrically coupled to the first die through at least the plurality of TSVs, the second substrate of the second package, the first set of interconnects, and the redistribution portion of the first package.

According to an aspect, the first set of interconnects includes at least one of a solder ball and/or a bump.

According to one aspect, the second die is one of at least a flip chip and/or a memory die.

According to an aspect, the second die is electrically coupled to the first die through at least the second substrate of the second package, the first set of interconnects, the redistribution portion of the first package, a second set of interconnects in the first package, and the first substrate of the first package.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a first package, a first set of interconnects, and a second package. The first package includes a first substrate comprising a first surface and a second surface; a first die coupled to the first surface of the first substrate; and a redistribution means configured to provide an electrical path for an electrical signal. The first set of interconnects is coupled to the redistribution means of the first package. The second package is coupled to the first package through the first set of interconnects. The second package includes a second substrate comprising a first surface and a second surface. The second die is coupled to the first surface of the second substrate, where the second die is electrically coupled to the first die through at least the second substrate of the second package, the first set of interconnects, and the redistribution means of the first package.

According to an aspect, the second package includes a third die coupled to the second surface of the second substrate. In some implementations, the third die is electrically coupled to the first die through at least the second substrate of the second package, the first set of interconnects, and the redistribution means of the first package.

According to one aspect, the second die and the third die are electrically coupled to the first die through a first electrical path that includes a combined electrical signal from the second die and the third die. In some implementations, the second die is coupled to the first die through a second electrical path that provides a control signal from the first die to the second die.

According to an aspect, the second package further comprises a third die is stacked on the second die, the second die comprising a plurality of through substrate vias (TSVs). In some implementations, the third die is electrically coupled to the first die through at least the plurality of TSVs, the second substrate of the second package, the first set of interconnects, and the redistribution means of the first package.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides an integrated device that includes a first substrate comprising a first surface and a second surface. The first substrate includes a first set of interconnects configured to provide a first electrical path for a first data signal, a second set of interconnects configured to provide a second electrical path for a first control signal, and a third set of interconnects configured to provide a third electrical path for a second control signal. The integrated device includes a first die coupled to the first surface of the first substrate, where the first die is electrically coupled to the first set of interconnects and the second set of interconnects. The integrated device includes a second die coupled to the second surface of the first substrate, where the second die is electrically coupled to the first set of interconnects and the third set of interconnects, the second die being electrically coupled to the first die through the first set of interconnects.

DRAWINGS

Various features, nature and advantages may become apparent from the detailed description set forth below when taken in conjunction with the drawings in which like reference characters identify correspondingly throughout.

Figure 18A:
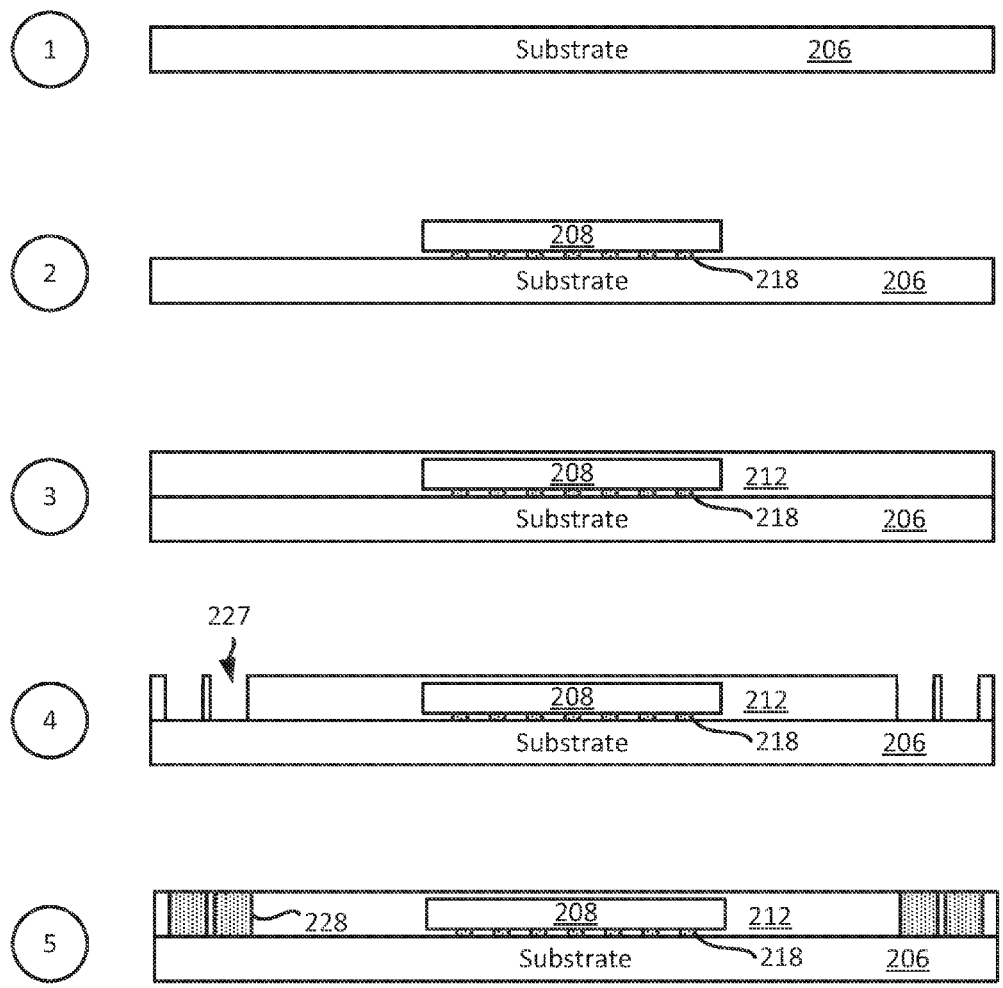
Figure 18B:
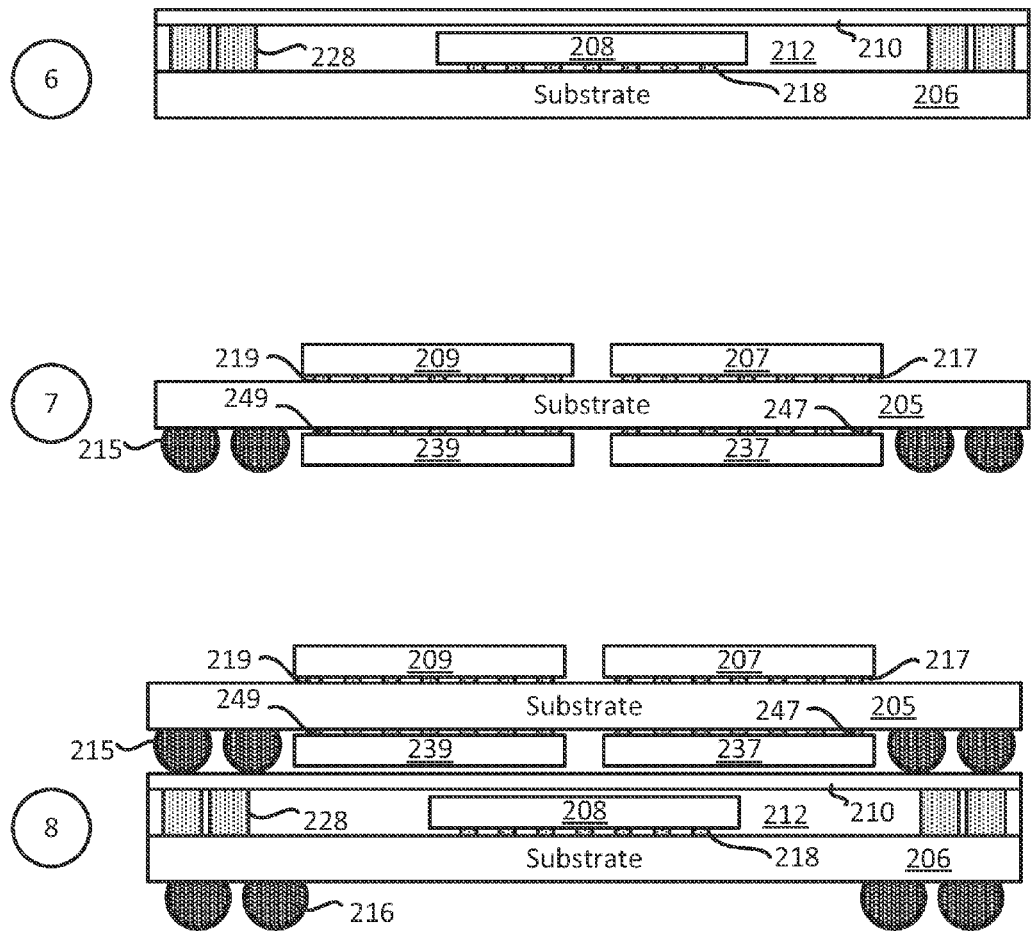

FIG. 18 (comprising FIG. 18A and FIG. 18B) illustrates an example of a sequence for fabricating a package on package (PoP) integrated device.

Figure 19A:
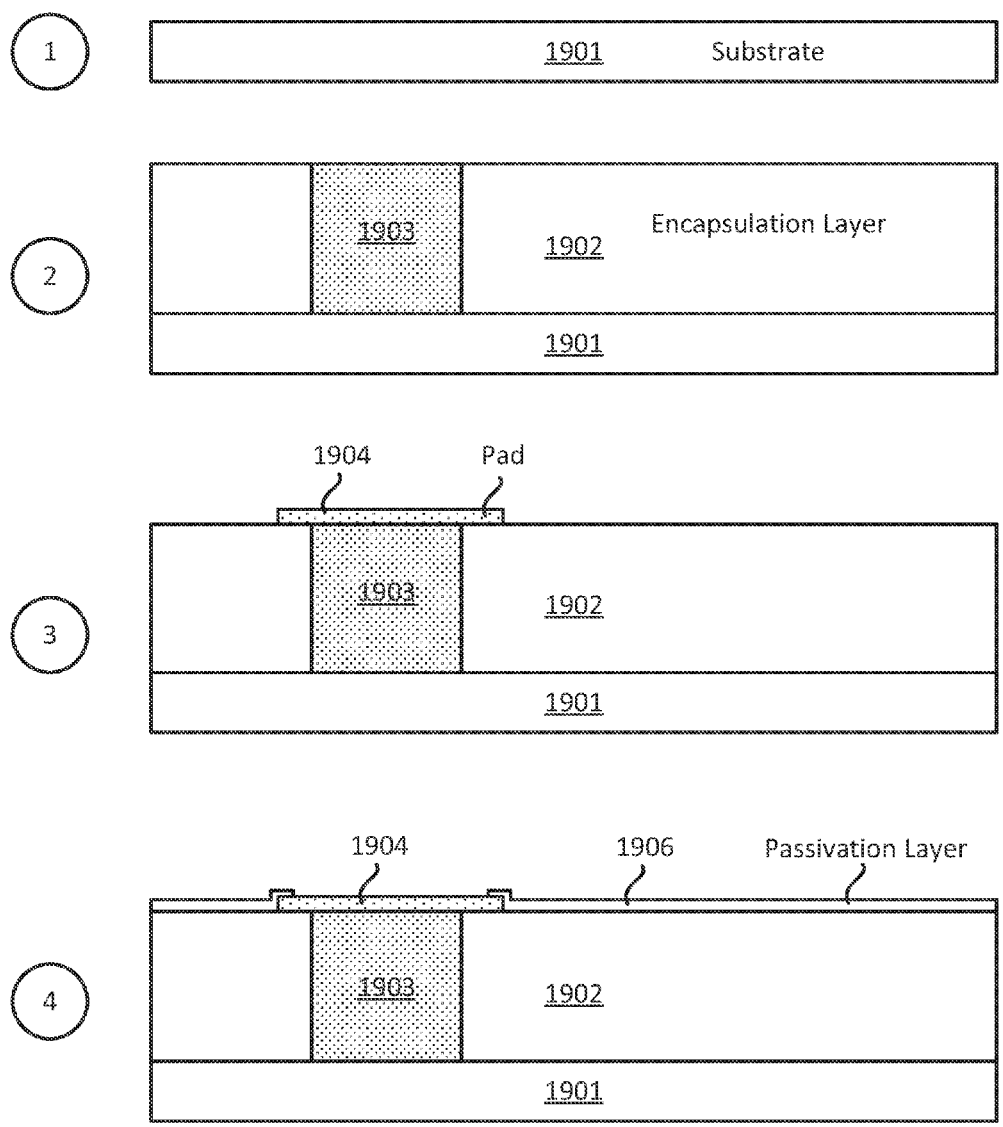
Figure 19B:
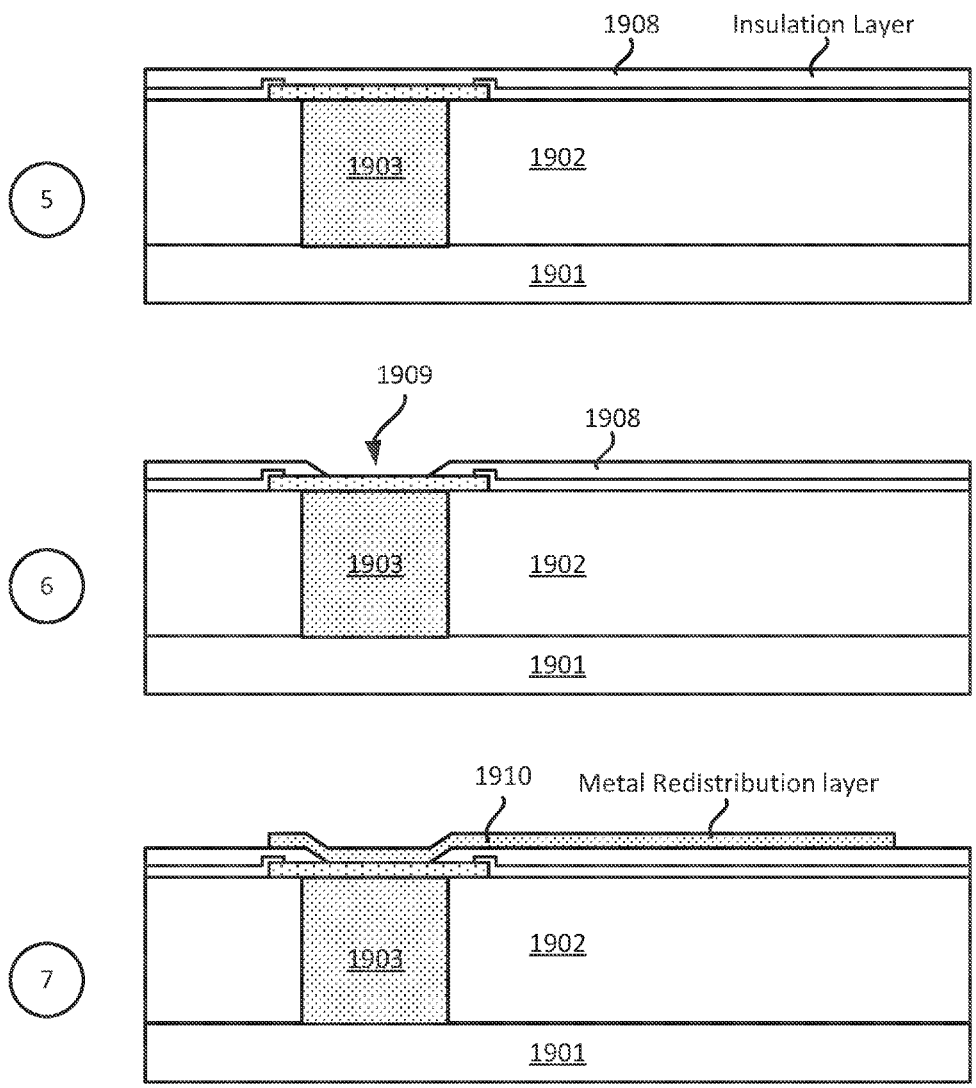
Figure 19C:
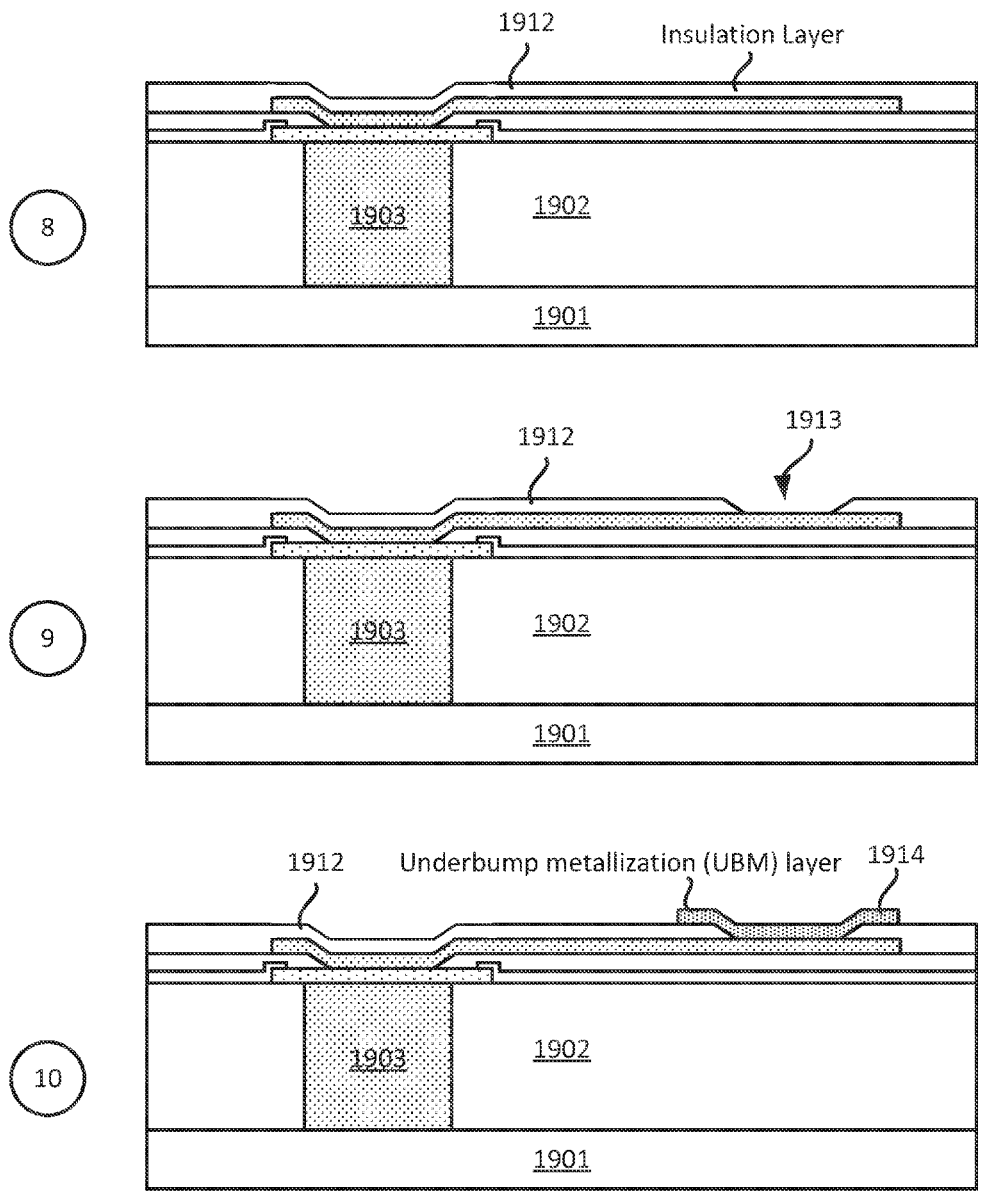

FIG. 19 (comprising FIG. 19A, FIG. 19B, and FIG. 19C) illustrates an example of a sequence for fabricating a redistribution portion of a package on package (PoP) integrated device.

Figure 20:
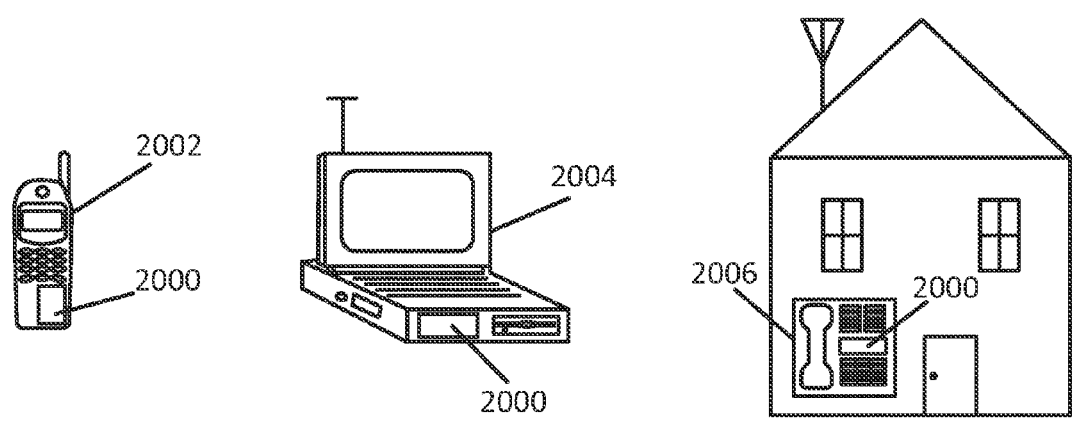

FIG. 20 illustrates various electronic devices that may integrate a semiconductor device, a die, an integrated circuit and/or PCB described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some features pertain to an integrated device that includes a first package, a set of interconnects, and a second package. The first package includes a first substrate comprising a first surface and a second surface. The first package includes a redistribution portion comprising a redistribution layer. The first package includes a first die coupled to the first surface of the first substrate. The set of interconnects is coupled to the redistribution portion of the first package. The second package is coupled to the first package through the set of interconnects. The second package includes (i) a second substrate comprising a first surface and a second surface; and (ii) a second die coupled to the first surface of the second substrate, where the second die is electrically coupled to the first die through the second substrate of the second package, the set of interconnects, and the redistribution portion of the first package.

In some implementations, the integrated device and/or package-on-package (PoP) device described in the present disclosure provide a better form factor (e.g., smaller, thinner) that meets the needs and/or requirements of mobile computing devices. Moreover, in some implementations, the integrated device and/or PoP device described in the present disclosure provide better integrated device performance (e.g., better signal, better channel, better electrical speed performance) than conventional devices.

Figure 1:
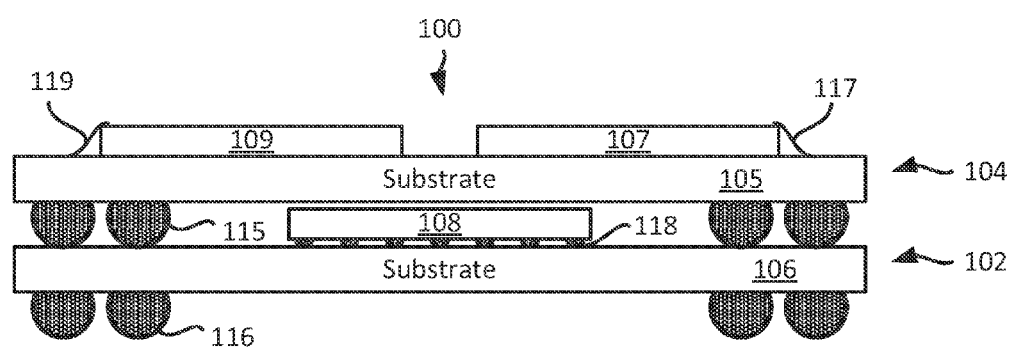
FIG. 1 illustrates a conventional package on package (PoP) integrated device.
Figure 2:
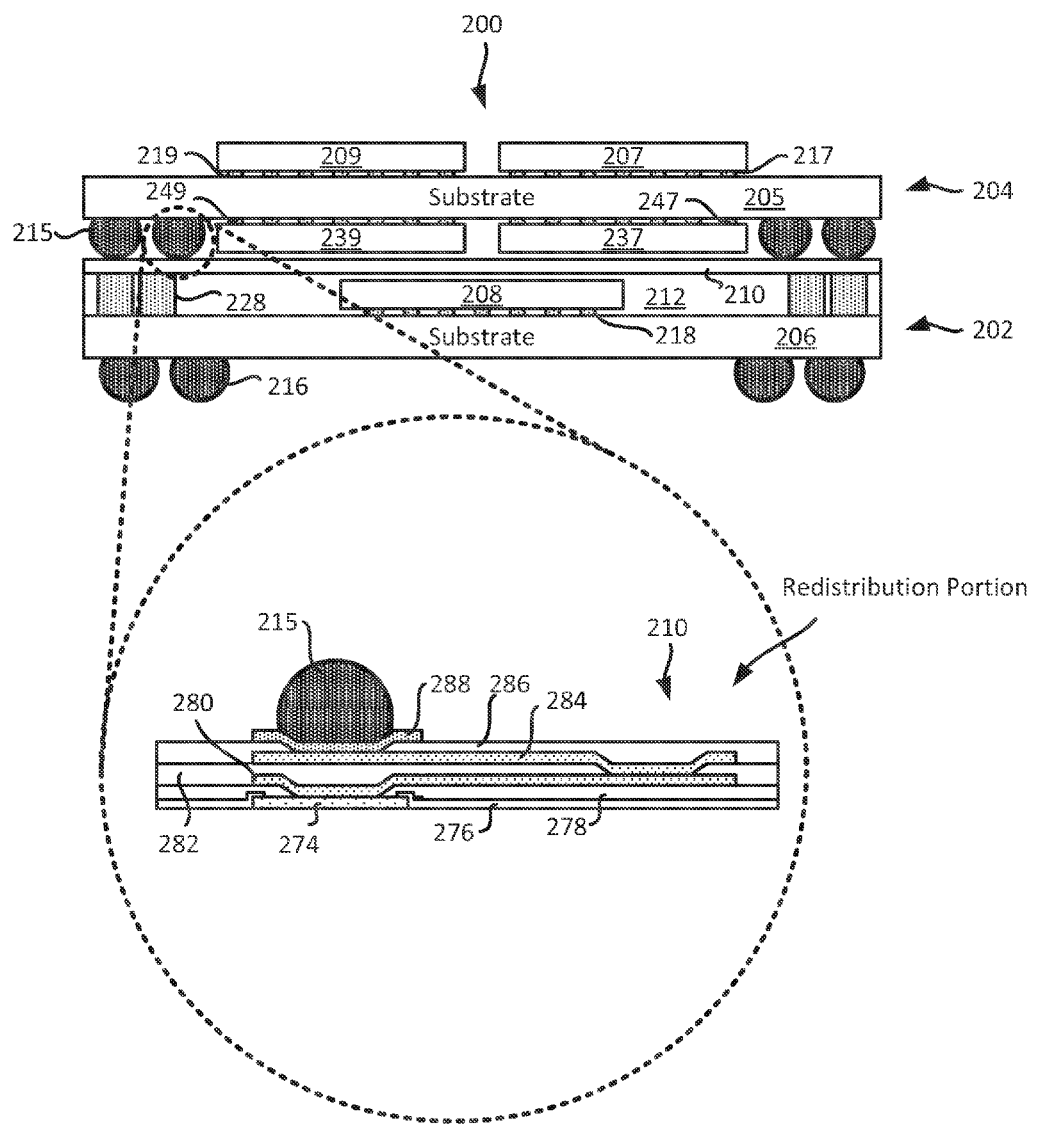
FIG. 2 illustrates an example of a package on package (PoP) integrated device that includes a redistribution layer.

Exemplary Package on Package (PoP) Integrated Device that Includes a Redistribution Portion FIG. 2 illustrates an example of a package on package (PoP) integrated device. As shown in FIG. 2, the integrated device 200 includes a first package 202 and a second package 204. The first package 202 includes a first substrate 206, a first die (e.g., chip) 208, a redistribution portion 210, an encapsulation material 212, a first set of solder balls 216, a first set of interconnects 218, and a first set of package interconnects 228. The first substrate 206 may include traces and/or vias (both of which are not shown).

The second package 204 includes a second substrate 205, a second die 207, a third die 209, a fourth die 237, a fifth die 239, a second set of solder balls 215, a second set of interconnect 217, a third set of interconnects 219, a fourth set of interconnects 247, and a fifth set of interconnects 249. The second substrate 205 may include traces and/or vias (both of which are not shown). The second package 204 is positioned above the first package 202.

The first die 208 is coupled to a first surface (e.g., top surface) of the first substrate 206 through the first set of interconnects 218. Different implementations may use different interconnects. In some implementations, the first set of interconnects 218 includes one of at least solder balls and/or bumps (e.g., copper pillars). The encapsulation material 212 may encapsulate the first die 208. Different implementations may use different materials for the encapsulation material 212. In some implementations, the encapsulation material 212 may include one of at least a mold, an epoxy, and/or a polymer fill. The first set of solder balls 216 is coupled to a second surface (e.g., bottom surface) of the first substrate 206. The first substrate 206 includes a set of traces and/or vias that may electrically connect to the first die 208 and/or the first set of solder balls 216.

In some implementations, the second die 207, the third die 209, the fourth die 237, and the fifth die 239 are flip chips. In some implementations, the second die 207, the third die 209, the fourth die 237, and the fifth die 239 are memory dies. The second die 207 and the third die 209 are coupled to a first surface (e.g., top surface) of the second substrate 205. The second die 207 is electrically coupled to the traces and/or vias of the second substrate 205 through the second set of interconnects 217. In some implementations, the second set of interconnects 217 includes one of at least solder balls and/or bumps (e.g., copper pillars). The third die 209 is electrically coupled to the traces and/or vias of the second substrate 205 through the third set of interconnects 219. In some implementations, the third set of interconnects 219 includes at least solder balls and/or bumps (e.g., copper pillars).

The fourth die 237 and the fifth die 239 are coupled to a second surface (e.g., bottom surface) of the second substrate 205. The fourth die 237 is electrically coupled to the traces and/or vias of the second substrate 205 through the fourth set of interconnects 247. In some implementations, the fourth set of interconnects 247 includes one of at least solder balls and/or bumps (e.g., copper pillars). The fifth die 239 is electrically coupled to the traces and/or vias of the second substrate 205 through the fifth set of interconnects 249. In some implementations, the fifth set of interconnects 249 includes at least solder balls and/or bumps (e.g., copper pillars).

The second set of solder balls 215 is coupled to the second surface (e.g., bottom surface) of the second substrate 205. The second set of solder balls 215 is also coupled to the redistribution portion 210 of the first package 202.

In some implementations, the redistribution portion 210 includes a first pad 274, a passivation layer 276, a first insulation layer 278 (e.g., first dielectric layer), a first redistribution layer 280, a second insulation layer 282 (e.g., second dielectric layer), a second redistribution layer 284, a third insulation layer 286 (e.g., third dielectric layer), and an under bump metallization (UBM) layer 288. The redistribution layers are metal layers. As shown in FIG. 2, one of the second set of solder balls 215 is coupled to the UBM layer 288. In some implementations, the UBM layer 288 may be optional. Different implementations may have different numbers of redistribution layers (e.g., 1, 2 or more metal layers). The first pad 274 may be coupled to one of the first set of package interconnects 228.

In some implementations, at least one of the second die 207, the third die 209, the fourth die 237, and/or the fifth die 239 may be electrically coupled to the first die 208. Different implementations may provide different electrical paths between the first die 208, the second die 207, the third die 209, the fourth die 237, and the fifth die 239.

In some implementations, the first die 208 may be electrically coupled to at least one of the second die 207, the third die 209, the fourth die 237, and the fifth die 239 through an electrical path that includes the first set of interconnects 218, the substrate 206 (e.g., traces and/or vias in the substrate), the first set package interconnects 228, the redistribution portion 210 (e.g., pad, redistribution layers, UBM layer), the second set of solder balls 215, the second substrate 205 (e.g., traces and/or vias in the substrate), the second set of interconnects 217, the third set of interconnects 219, the fourth set of interconnects 247, and/or the fifth set of interconnects 249.

In some implementations, the first set of package interconnects 228 (e.g., copper pillar) has a first pitch, and the second set of solder balls 215 has a second pitch. In some implementations, the first pitch is equal or less than the second pitch.

Figure 3:
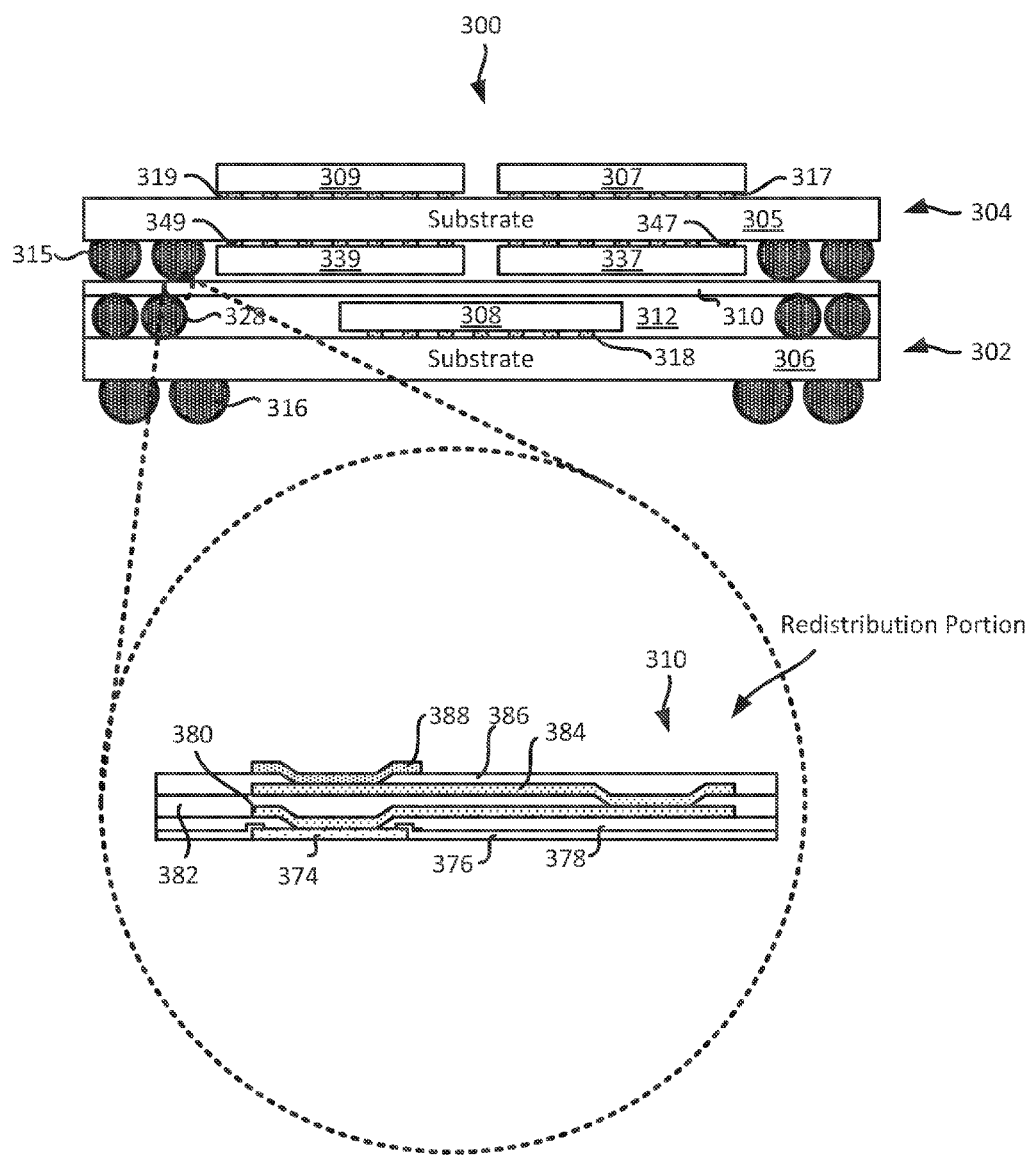
FIG. 3 illustrates another example of a package on package (PoP) integrated device that includes a redistribution layer.

FIG. 3 illustrates another example of a package on package (PoP) integrated device. As shown in FIG. 3, the integrated device 300 includes a first package 302 and a second package 304. The first package 302 includes a first substrate 306, a first die (e.g., chip) 308, a redistribution portion 310, an encapsulation material 312, a first set of solder balls 316, a first set of interconnects 318, and a second set of solder balls 328. The first substrate 306 may include traces and/or vias (both of which are not shown).

The second package 304 includes a second substrate 305, a second die 307, a third die 309, a fourth die 337, a fifth die 339, a third set of solder balls 315, a second set of interconnect 317, a third set of interconnects 319, a fourth set of interconnects 347, and a fifth set of interconnects 349. The second substrate 305 may include traces and/or vias (both of which are not shown). The second package 304 is positioned above the first package 302.

The first die 308 is coupled to a first surface (e.g., top surface) of the first substrate 306 through the first set of interconnects 318. Different implementations may use different interconnects. In some implementations, the first set of interconnects 318 includes one of at least solder balls and/or bumps (e.g., copper pillars). The encapsulation material 312 may encapsulate the first die 308. Different implementations may use different materials for the encapsulation material 312. In some implementations, the encapsulation material 312 may include one of at least a mold, an epoxy, and/or a polymer fill. The first set of solder balls 316 is coupled to a second surface (e.g., bottom surface) of the first substrate 306. The first substrate 306 includes a set of traces and/or vias that may electrically connect to the first die 308 and/or the first set of solder balls 316.

In some implementations, the second die 307, the third die 309, the fourth die 337, and the fifth die 339 are flip chips. In some implementations, the second die 307, the third die 309, the fourth die 337, and the fifth die 339 are memory dies. The second die 307 and the third die 309 are coupled to a first surface (e.g., top surface) of the second substrate 305. The second die 307 is electrically coupled to the traces and/or vias of the second substrate 305 through the second set of interconnects 317. In some implementations, the second set of interconnects 317 includes one of at least solder balls and/or bumps (e.g., copper pillars). The third die 309 is electrically coupled to the traces and/or vias of the second substrate 305 through the third set of interconnects 319. In some implementations, the third set of interconnects 319 includes at least solder balls and/or bumps (e.g., copper pillars).

The fourth die 337 and the fifth die 339 are coupled to a second surface (e.g., bottom surface) of the second substrate 305. The fourth die 337 is electrically coupled to the traces and/or vias of the second substrate 305 through the fourth set of interconnects 347. In some implementations, the fourth set of interconnects 347 includes one of at least solder balls and/or bumps (e.g., copper pillars). The fifth die 339 is electrically coupled to the traces and/or vias of the second substrate 305 through the fifth set of interconnects 349. In some implementations, the fifth set of interconnects 349 includes at least solder balls and/or bumps (e.g., copper pillars).

The third set of solder balls 315 is coupled to the second surface (e.g., bottom surface) of the second substrate 305. The third set of solder balls 315 is also coupled to the redistribution portion 310 of the first package 302.

In some implementations, the redistribution portion 310 includes a first pad 374, a passivation layer 376, a first insulation layer 378 (e.g., first dielectric layer), a first redistribution layer 380, a second insulation layer 382 (e.g., second dielectric layer), a second redistribution layer 384, a third insulation layer 386 (e.g., third dielectric layer), and an under bump metallization (UBM) layer 388. The redistribution layers are metal layers. As shown in FIG. 3, one of the third set of solder balls 315 is coupled to the UBM layer 388. In some implementations, the UBM layer 388 may be optional. Different implementations may have different numbers of redistribution layers (e.g., 1, 3 or more metal layers).

In some implementations, at least one of the second die 307, the third die 309, the fourth die 337, and/or the fifth die 339 may be electrically coupled to the first die 308. Different implementations may provide different electrical paths between the first die 308, the second die 307, the third die 309, the fourth die 337, and the fifth die 339.

In some implementations, the first die 308 may be electrically coupled to at least one of the second die 307, the third die 309, the fourth die 337, and the fifth die 339 through an electrical path that includes the first set of interconnects 318, the substrate 306 (e.g., traces and/or vias in the substrate), the second set of solder balls 328, the redistribution portion 310 (e.g., pad, redistribution layers, UBM layer), the third set of solder balls 315, the second substrate 305 (e.g., traces and/or vias in the substrate), the second set of interconnects 317, the third set of interconnects 319, the fourth set of interconnects 347, and/or the fifth set of interconnects 349.

In some implementations, the second set of solder balls 328 has a first pitch, and the third set of solder balls 315 has a second pitch. In some implementations, the first pitch is equal or less than the second pitch.

Exemplary Die in a Package on Package (PoP) Integrated Device

Figure 4:
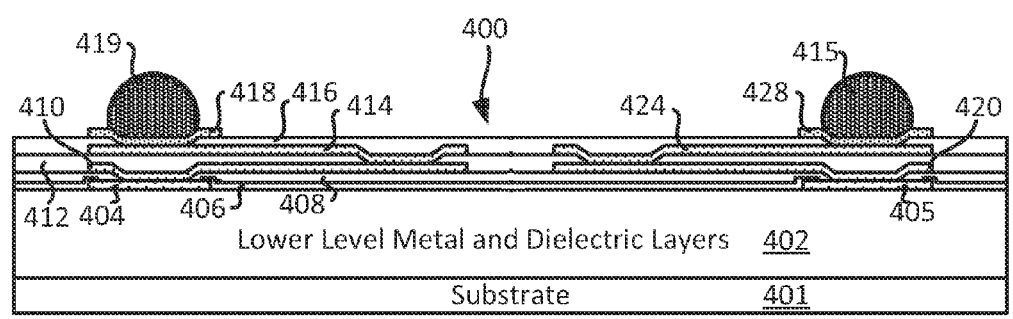
FIG. 4 illustrates an example of a die.

FIG. 4 conceptually illustrates an example of a die that may be provided in a package on package (PoP) integrated device described in the present disclosure. Specifically, FIG. 4 illustrates an integrated device 400 (e.g., die, die package) that includes a substrate 401, several lower level metal layers and dielectric layers 402, a first pad 404, a second pad 405, a passivation layer 406, a first insulation layer 408 (e.g., first dielectric layer), a first redistribution interconnect 410, a second insulation layer 412 (e.g., second dielectric layer), a second redistribution interconnect 414, a third insulation layer 416 (e.g., third dielectric layer), a first under bump metallization (UBM) layer 418, a third redistribution interconnect 420, a fourth redistribution interconnect 424, and a second under bump metallization (UBM) layer 428. In some implementations, the first redistribution interconnect 410 and the third redistribution interconnect 420 are a first redistribution layer of the integrated device 400. In some implementations, the second redistribution interconnect 414 and the fourth redistribution interconnect 424 are a second redistribution layer of the integrated device 400. In some implementations, the first pad 404, the second pad 405, the passivation layer 406, the first insulation layer 408 (e.g., first dielectric layer), the first redistribution interconnect 410, the second insulation layer 412 (e.g., second dielectric layer), the second redistribution interconnect 414, the third insulation layer 216 (e.g., third dielectric layer), the first under bump metallization (UBM) layer 418, the third redistribution interconnect 420, the fourth redistribution interconnect 424, and the second under bump metallization (UBM) layer 428 are part of a redistribution portion of the integrated device 400. Different implementations may have different numbers of redistribution metal layers (e.g., 1, 2 or more metal layers). A first solder ball 419 is coupled to the first UBM layer 418, and a second solder ball 417 is coupled to the second UBM layer 428.

In some implementations, the integrated device 400 includes a front side (e.g., active side) and a back side. In some implementations, the front side of the integrated device 400 may include the redistribution portion of the integrated device 400. In some implementations, the back side of the integrated device 400 may include the substrate 401 of the integrated device 400.

Figure 5:
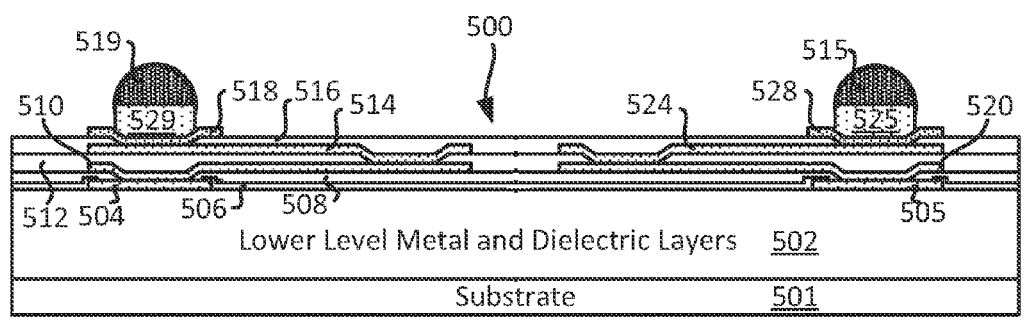
FIG. 5 illustrates another example of a die.

FIG. 5 conceptually illustrates an example of a die that may be provided in a package on package (PoP) integrated device described in the present disclosure. Specifically, FIG. 5 illustrates an integrated device 500 (e.g., die, die package) that includes a substrate 501, several lower level metal layers and dielectric layers 502, a first pad 504, a second pad 505, a passivation layer 506, a first insulation layer 508 (e.g., first dielectric layer), a first redistribution interconnect 510, a second insulation layer 512 (e.g., second dielectric layer), a second redistribution interconnect 514, a third insulation layer 516 (e.g., third dielectric layer), a first under bump metallization (UBM) layer 518, a third redistribution interconnect 520, a fourth redistribution interconnect 524, and a second under bump metallization (UBM) layer 528. In some implementations, the first redistribution interconnect 510 and the third redistribution interconnect 520 are a first redistribution layer of the integrated device 500. In some implementations, the second redistribution interconnect 514 and the fourth redistribution interconnect 524 are a second redistribution layer of the integrated device 500. In some implementations, the first pad 504, the second pad 505, the passivation layer 506, the first insulation layer 508 (e.g., first dielectric layer), the first redistribution interconnect 510, the second insulation layer 512 (e.g., second dielectric layer), the second redistribution interconnect 514, the third insulation layer 516 (e.g., third dielectric layer), the first under bump metallization (UBM) layer 518, the third redistribution interconnect 520, the fourth redistribution interconnect 524, and the second under bump metallization (UBM) layer 528 are part of a redistribution portion of the integrated device 500. Different implementations may have different numbers of redistribution metal layers (e.g., 1, 2 or more metal layers). A first bump is coupled to the first UBM layer 518. The first bump includes a first pillar 529 (e.g., copper pillar) and a first solder ball 519. A second bump is coupled to the second UBM layer 528. The second bump includes a second pillar 527 (e.g., copper pillar) and a second solder ball 517.

In some implementations, the integrated device 500 includes a front side (e.g., active side) and a back side. In some implementations, the front side of the integrated device 500 may include the redistribution portion of the integrated device 500. In some implementations, the back side of the integrated device 500 may include the substrate 501 of the integrated device 500.

Figure 6:
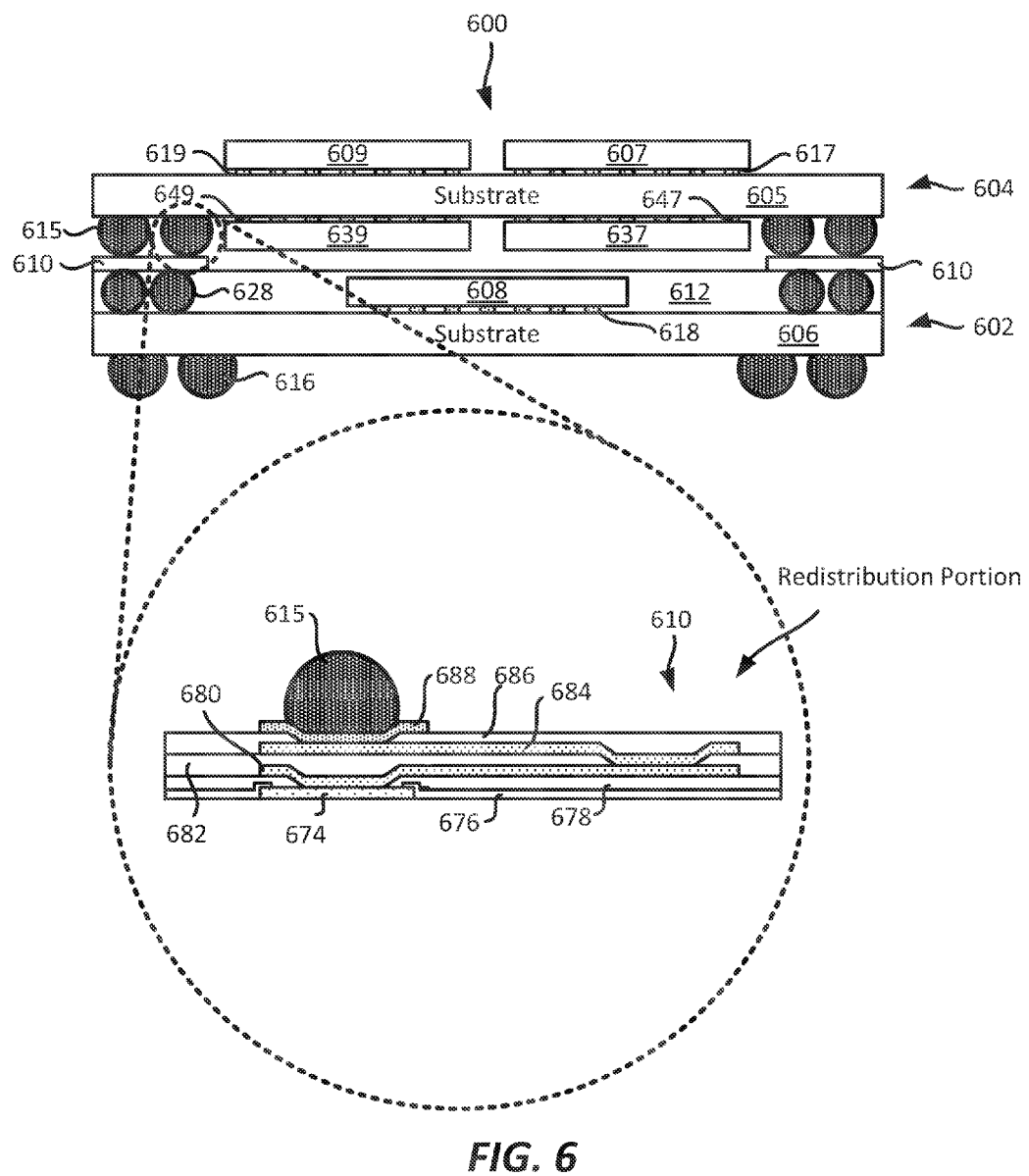
FIG. 6 illustrates an example of a package on package (PoP) integrated device that includes a redistribution layer.

It should be noted that FIGS. 5 and 6 are merely examples of dies that may be provided in the package on package (PoP) integrated devices described in the present disclosure. In some implementations, other dies with different components and configurations (e.g., dies with through substrate vias (TSVs)) may be used in the package on package (PoP) integrated devices described in the present disclosure.

Exemplary Package on Package (PoP) Integrated Device that Includes a Partial Redistribution Portion FIG. 6 illustrates another example of a package on package (PoP) integrated device. As shown in FIG. 6, the integrated device 600 includes a first package 602 and a second package 604. The first package 602 includes a first substrate 606, a first die (e.g., chip) 608, a redistribution portion 610, an encapsulation material 612, a first set of solder balls 616, a first set of interconnects 618, and a first set of package interconnects 628 (e.g., set of solder balls, pillars). The first substrate 606 may include traces and/or vias (both of which are not shown). As shown in FIG. 6, the redistribution layer 610 partially covers the first package 602.

The second package 604 includes a second substrate 605, a second die 607, a third die 609, a fourth die 637, a fifth die 639, a second set of solder balls 615, a second set of interconnect 617, a third set of interconnects 619, a fourth set of interconnects 647, and a fifth set of interconnects 649. The second substrate 605 may include traces and/or vias (both of which are not shown). The second package 604 is positioned above the first package 602.

The first die 608 is coupled to a first surface (e.g., top surface) of the first substrate 606 through the first set of interconnects 618. Different implementations may use different interconnects. In some implementations, the first set of interconnects 618 includes one of at least solder balls and/or bumps (e.g., copper pillars). The encapsulation material 612 may encapsulate the first die 608. Different implementations may use different materials for the encapsulation material 612. In some implementations, the encapsulation material 612 may include one of at least a mold, an epoxy, and/or a polymer fill. The first set of solder balls 616 is coupled to a second surface (e.g., bottom surface) of the first substrate 606. The first substrate 606 includes a set of traces and/or vias that may electrically connect to the first die 608 and/or the first set of solder balls 616.

In some implementations, the second die 607, the third die 609, the fourth die 637, and the fifth die 639 are flip chips. In some implementations, the second die 607, the third die 609, the fourth die 637, and the fifth die 639 are memory dies. The second die 607 and the third die 609 are coupled to a first surface (e.g., top surface) of the second substrate 605. The second die 607 is electrically coupled to the traces and/or vias of the second substrate 605 through the second set of interconnects 617. In some implementations, the second set of interconnects 617 includes one of at least solder balls and/or bumps (e.g., copper pillars). The third die 609 is electrically coupled to the traces and/or vias of the second substrate 605 through the third set of interconnects 619. In some implementations, the third set of interconnects 619 includes at least solder balls and/or bumps (e.g., copper pillars).

The fourth die 637 and the fifth die 639 are coupled to a second surface (e.g., bottom surface) of the second substrate 605. The fourth die 637 is electrically coupled to the traces and/or vias of the second substrate 605 through the fourth set of interconnects 647. In some implementations, the fourth set of interconnects 647 includes one of at least solder balls and/or bumps (e.g., copper pillars). The fifth die 639 is electrically coupled to the traces and/or vias of the second substrate 605 through the fifth set of interconnects 649. In some implementations, the fifth set of interconnects 649 includes at least solder balls and/or bumps (e.g., copper pillars).

The second set of solder balls 615 is coupled to the second surface (e.g., bottom surface) of the second substrate 605. The second set of solder balls 615 is also coupled to the redistribution portion 610 of the first package 602.

In some implementations, the redistribution portion 610 includes a first pad 674, a passivation layer 676, a first insulation layer 678 (e.g., first dielectric layer), a first redistribution layer 680, a second insulation layer 682 (e.g., second dielectric layer), a second redistribution layer 684, a third insulation layer 686 (e.g., third dielectric layer), and an under bump metallization (UBM) layer 688. The redistribution layers are metal layers. As shown in FIG. 6, one of the second set of solder balls 615 is coupled to the UBM layer 688. In some implementations, the UBM layer 688 may be optional. Different implementations may have different numbers of redistribution layers (e.g., 1, 6 or more metal layers).

In some implementations, at least one of the second die 607, the third die 609, the fourth die 637, and/or the fifth die 639 may be electrically coupled to the first die 608. Different implementations may provide different electrical paths between the first die 608, the second die 607, the third die 609, the fourth die 637, and the fifth die 639.

In some implementations, the first die 608 may be electrically coupled to at least one of the second die 607, the third die 609, the fourth die 637, and the fifth die 639 through an electrical path that includes the first set of interconnects 618, the substrate 606 (e.g., traces and/or vias in the substrate), the first set of package interconnects 628, the redistribution portion 610 (e.g., pad, redistribution layers, UBM layer), the second set of solder balls 615, the second substrate 605 (e.g., traces and/or vias in the substrate), the second set of interconnects 617, the third set of interconnects 619, the fourth set of interconnects 647, and/or the fifth set of interconnects 649.

In some implementations, the first set of package interconnects 628 (e.g., solder balls, copper pillars) has a first pitch, and the second set of solder balls 615 has a second pitch. In some implementations, the first pitch is equal or less than the second pitch.

Exemplary Package on Package (PoP) Integrated Device that Includes a Redistribution Portion and a Die with Through Substrate Via (TSV)

Figure 7:
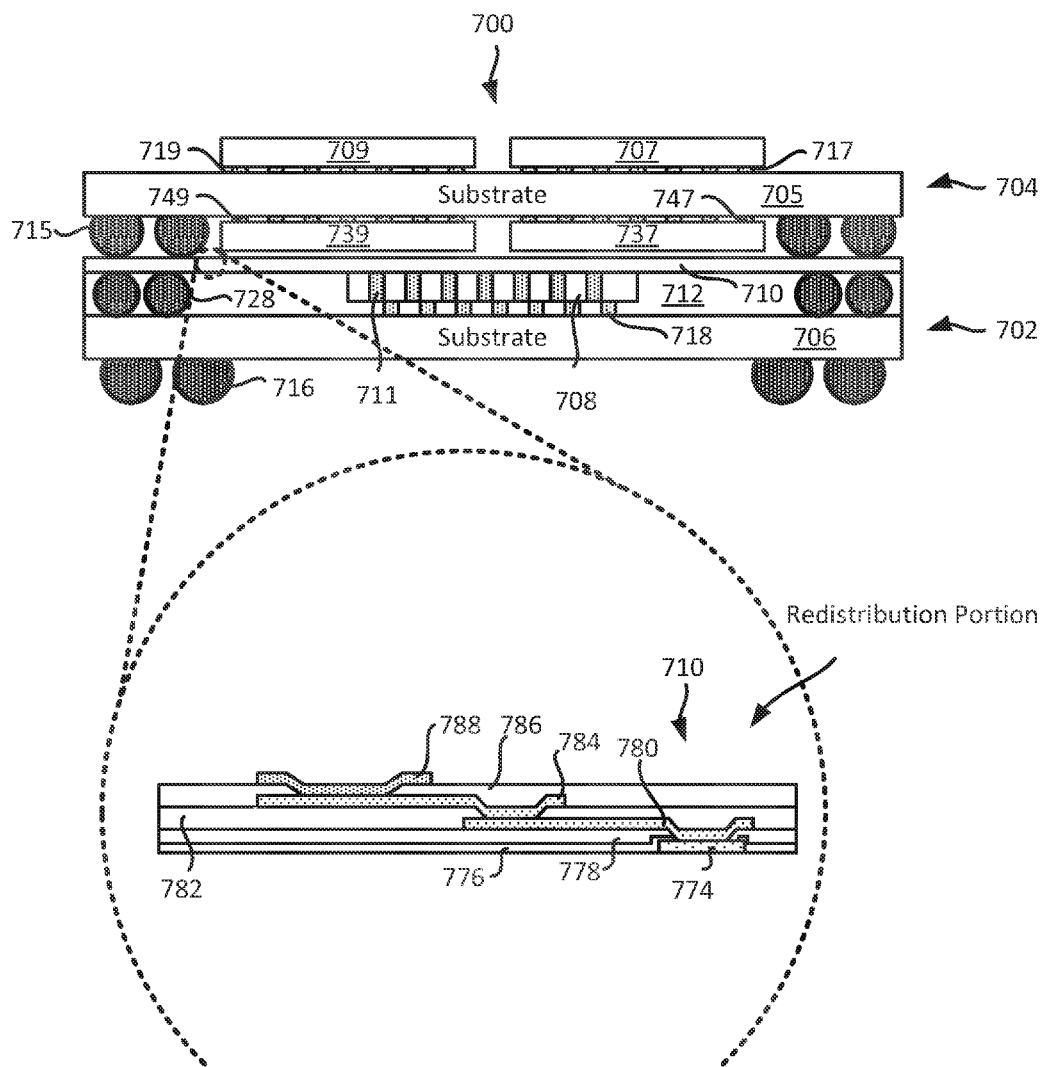
FIG. 7 illustrates another example of a package on package (PoP) integrated device that includes a redistribution layer.

FIG. 7 illustrates another example of a package on package (PoP) integrated device. As shown in FIG. 7, the integrated device 700 includes a first package 702 and a second package 704. The first package 702 includes a first substrate 706, a first die (e.g., chip) 708, a redistribution portion 710, an encapsulation material 712, a first set of solder balls 716, a first set of interconnects 718, and a first set of package interconnects 728 (e.g., set of solder balls). The first substrate 706 may include traces and/or vias (both of which are not shown). The first die 708 includes a set of through substrate vias (TSVs) 711.

The second package 704 includes a second substrate 705, a second die 707, a third die 709, a fourth die 737, a fifth die 739, a second set of solder balls 715, a second set of interconnect 717, a third set of interconnects 719, a fourth set of interconnects 747, and a fifth set of interconnects 749. The second substrate 705 may include traces and/or vias (both of which are not shown). The second package 704 is positioned above the first package 702.

The first die 708 is coupled to a first surface (e.g., top surface) of the first substrate 706 through the first set of interconnects 718. Different implementations may use different interconnects. In some implementations, the first set of interconnects 718 includes one of at least solder balls and/or bumps (e.g., copper pillars). The first die 708 is also coupled to a first surface (e.g., bottom surface) of the redistribution portion 710. In some implementations, the set of TSVs 711 of the first die 708 is coupled the redistribution portion 710 (e.g., pad, redistribution layer). The encapsulation material 712 may encapsulate the first die 708. Different implementations may use different materials for the encapsulation material 712. In some implementations, the encapsulation material 712 may include one of at least a mold, an epoxy, and/or a polymer fill. The first set of solder balls 716 is coupled to a second surface (e.g., bottom surface) of the first substrate 706. The first substrate 706 includes a set of traces and/or vias that may electrically connect to the first die 708 and/or the first set of solder balls 716.

In some implementations, the second die 707, the third die 709, the fourth die 737, and the fifth die 739 are flip chips. In some implementations, the second die 707, the third die 709, the fourth die 737, and the fifth die 739 are memory dies. The second die 707 and the third die 709 are coupled to a first surface (e.g., top surface) of the second substrate 705. The second die 707 is electrically coupled to the traces and/or vias of the second substrate 705 through the second set of interconnects 717. In some implementations, the second set of interconnects 717 includes one of at least solder balls and/or bumps (e.g., copper pillars). The third die 709 is electrically coupled to the traces and/or vias of the second substrate 705 through the third set of interconnects 719. In some implementations, the third set of interconnects 719 includes at least solder balls and/or bumps (e.g., copper pillars).

The fourth die 737 and the fifth die 739 are coupled to a second surface (e.g., bottom surface) of the second substrate 705. The fourth die 737 is electrically coupled to the traces and/or vias of the second substrate 705 through the fourth set of interconnects 747. In some implementations, the fourth set of interconnects 747 includes one of at least solder balls and/or bumps (e.g., copper pillars). The fifth die 739 is electrically coupled to the traces and/or vias of the second substrate 705 through the fifth set of interconnects 749. In some implementations, the fifth set of interconnects 749 includes at least solder balls and/or bumps (e.g., copper pillars).

The second set of solder balls 715 is coupled to the second surface (e.g., bottom surface) of the second substrate 705. The second set of solder balls 715 is also coupled to the redistribution portion 710 of the first package 702.

In some implementations, the redistribution portion 710 includes a first pad 774, a passivation layer 776, a first insulation layer 778 (e.g., first dielectric layer), a first redistribution layer 780, a second insulation layer 782 (e.g., second dielectric layer), a second redistribution layer 784, a third insulation layer 786 (e.g., third dielectric layer), and an under bump metallization (UBM) layer 788. The redistribution layers are metal layers. As shown in FIG. 7, one of the second set of solder balls 715 is coupled to the UBM layer 788. In some implementations, the UBM layer 788 may be optional. Different implementations may have different numbers of redistribution layers (e.g., 1, 7 or more metal layers).

In some implementations, at least one of the second die 707, the third die 709, the fourth die 737, and/or the fifth die 739 may be electrically coupled to the first die 708. Different implementations may provide different electrical paths between the first die 708, the second die 707, the third die 709, the fourth die 737, and the fifth die 739.

In some implementations, the first die 708 may be electrically coupled to at least one of the second die 707, the third die 709, the fourth die 737, and the fifth die 739 through an electrical path that includes the set of TSVs 711, the redistribution portion 710 (e.g., pad, redistribution layers, UBM layer), the second set of solder balls 715, the second substrate 705 (e.g., traces and/or vias in the substrate), the second set of interconnects 717, the third set of interconnects 719, the fourth set of interconnects 747, and/or the fifth set of interconnects 749. In some implementations, the electrical path may bypass the substrate 706 and/or the first set of package interconnects 728.

In some implementations, the first set of package interconnects 728 (e.g., solder balls, copper pillars) has a first pitch, and the second set of solder balls 715 has a second pitch. In some implementations, the first pitch is equal or less than the second pitch.

Figure 8:
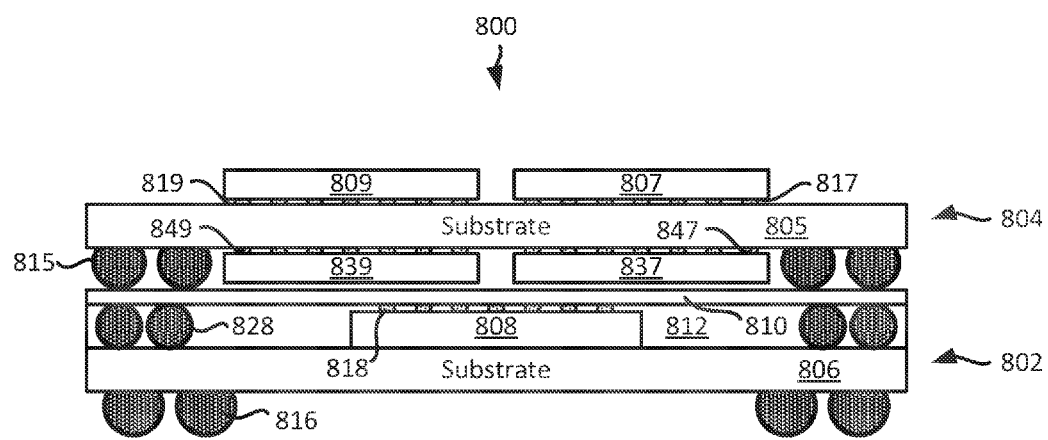
FIG. 8 illustrates yet another example of a package on package (PoP) integrated device that includes a redistribution layer.

Exemplary Package on Package (PoP) Integrated Device that Includes a Die Electrically Coupled to a Redistribution Portion FIG. 8 illustrates another example of a package on package (PoP) integrated device. As shown in FIG. 8, the integrated device 800 includes a first package 802 and a second package 804. The first package 802 includes a first substrate 806, a first die (e.g., chip) 808, a redistribution portion 810, an encapsulation material 812, a first set of solder balls 816, a first set of interconnects 818, and a first set of package interconnects 828 (e.g., set of solder balls, pillars). The first substrate 806 may include traces and/or vias (both of which are not shown).

The second package 804 includes a second substrate 805, a second die 807, a third die 809, a fourth die 837, a fifth die 839, a second set of solder balls 815, a second set of interconnect 817, a third set of interconnects 819, a fourth set of interconnects 847, and a fifth set of interconnects 849. The second substrate 805 may include traces and/or vias (both of which are not shown). The second package 804 is positioned above the first package 802.

The first die 808 is coupled to a first surface (e.g., bottom surface) of the redistribution portion 810 through the first set of interconnects 818. In some implementations, the first die 808 includes a front side region and a back side region. In some implementations, the front side (e.g., active side) portion of the first die 808 is coupled to the redistribution portion 810. Different implementations may use different interconnects. In some implementations, the first set of interconnects 818 includes one of at least solder balls and/or bumps (e.g., copper pillars). The encapsulation material 812 may encapsulate the first die 808. Different implementations may use different materials for the encapsulation material 812. In some implementations, the encapsulation material 812 may include one of at least a mold, an epoxy, and/or a polymer fill. The first set of solder balls 816 is coupled to a second surface (e.g., bottom surface) of the first substrate 806. The first substrate 806 includes a set of traces and/or vias that may electrically connect to the first die 808 and/or the first set of solder balls 816.

In some implementations, the second die 807, the third die 809, the fourth die 837, and the fifth die 839 are flip chips. In some implementations, the second die 807, the third die 809, the fourth die 837, and the fifth die 839 are memory dies. The second die 807 and the third die 809 are coupled to a first surface (e.g., top surface) of the second substrate 805. The second die 807 is electrically coupled to the traces and/or vias of the second substrate 805 through the second set of interconnects 817. In some implementations, the second set of interconnects 817 includes one of at least solder balls and/or bumps (e.g., copper pillars). The third die 809 is electrically coupled to the traces and/or vias of the second substrate 805 through the third set of interconnects 819. In some implementations, the third set of interconnects 819 includes at least solder balls and/or bumps (e.g., copper pillars).

The fourth die 837 and the fifth die 839 are coupled to a second surface (e.g., bottom surface) of the second substrate 805. The fourth die 837 is electrically coupled to the traces and/or vias of the second substrate 805 through the fourth set of interconnects 847. In some implementations, the fourth set of interconnects 847 includes one of at least solder balls and/or bumps (e.g., copper pillars). The fifth die 839 is electrically coupled to the traces and/or vias of the second substrate 805 through the fifth set of interconnects 849. In some implementations, the fifth set of interconnects 849 includes at least solder balls and/or bumps (e.g., copper pillars).

The second set of solder balls 815 is coupled to the second surface (e.g., bottom surface) of the second substrate 805. The second set of solder balls 815 is also coupled to the redistribution portion 810 of the first package 802.

In some implementations, the redistribution portion 810 includes a first pad, a passivation layer, a first insulation layer (e.g., first dielectric layer), a first redistribution layer, a second insulation layer (e.g., second dielectric layer), a second redistribution layer, a third insulation layer (e.g., third dielectric layer), and an under bump metallization (UBM) layer (e.g., similar to the redistribution portions 310, 410, 510, 610, 710). The redistribution layers are metal layers. Different implementations may have different numbers of redistribution layers (e.g., 1, 8 or more metal layers).

In some implementations, at least one of the second die 807, the third die 809, the fourth die 837, and/or the fifth die 839 may be electrically coupled to the first die 808. Different implementations may provide different electrical paths between the first die 808, the second die 807, the third die 809, the fourth die 837, and the fifth die 839.

In some implementations, the first die 808 may be electrically coupled to at least one of the second die 807, the third die 809, the fourth die 837, and the fifth die 839 through an electrical path that includes the first set of interconnects 818, the redistribution portion 810 (e.g., pad, redistribution layers, UBM layer), the second set of solder balls 815, the second substrate 805 (e.g., traces and/or vias in the substrate), the second set of interconnects 817, the third set of interconnects 819, the fourth set of interconnects 847, and/or the fifth set of interconnects 849. In some implementations, the electrical path may bypass the substrate 806 and/or the first set of package interconnects 828.

In some implementations, the first set of package interconnects 828 (e.g., solder balls, copper pillars) has a first pitch, and the second set of solder balls 815 has a second pitch. In some implementations, the first pitch is equal or less than the second pitch.

Figure 9:
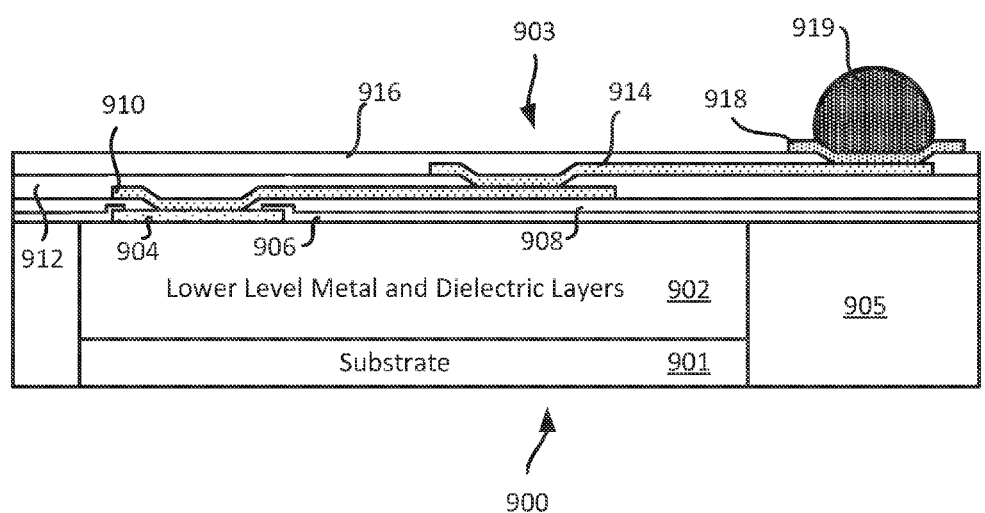
FIG. 9 illustrates an example of a close up view of a redistribution portion of a package on package (PoP) integrated device that includes a redistribution layer.

FIG. 9 illustrates a close up view of a die 900 coupled to a redistribution portion 903 of a package on package (PoP) integrated device. As shown in FIG. 9, the die 900 includes a substrate 901 and several lower level metal layers and dielectric layers 902. The redistribution portion 903 includes a first pad 904, a passivation layer 906, a first insulation layer 908 (e.g., first dielectric layer), a first redistribution layer 910, a second insulation layer 912 (e.g., second dielectric layer), a second redistribution layer 914, a third insulation layer 916 (e.g., third dielectric layer), and an under bump metallization (UBM) layer 918. Different implementations may have different numbers of redistribution metal layers (e.g., 1, 2 or more metal layers).

FIG. 9 also illustrates a solder ball 919 coupled to the UBM layer 918. The first and second redistribution layers 910 and 914 may be conductive layers (e.g., metal layer, copper layer) in some implementations. The substrate 901 may include one of at least silicon, glass, ceramic, and/or dielectric. In some implementations, the metal layers of the lower level metal layers and dielectric layers 902 are configured to provide one or more electrical paths (e.g., routes, interconnects) to one or more circuit elements (not shown) in the integrated device 900. The die 900 includes a front side region (e.g., active region) and a back side region. The front side region may include portions of the lower level metal and dielectric layers 902 of the die 900. The back side region may include the substrate 901 of the die 900.

FIG. 9 also illustrates an encapsulation material 905 that is coupled to the die 900. For example, the encapsulation material 905 may surround the die 900. Different implementations may use different materials for the encapsulation material 905. In some implementations, the encapsulation material 905 may include one of at least a mold, an epoxy, and/or a polymer fill. In some implementations, the redistribution portion 903 is provided on top of the die 900 and the encapsulation material 905.

Exemplary Package on Package (PoP) Integrated Device that Includes Stacked Dies

Figure 10:
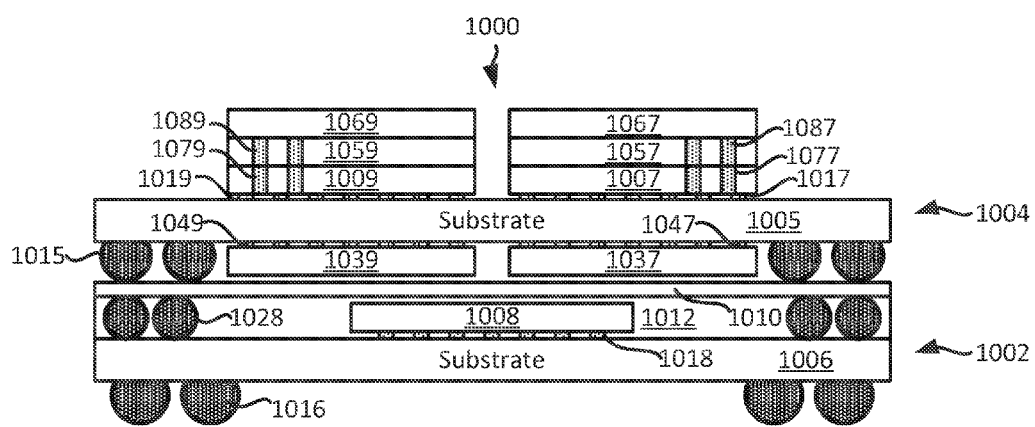
FIG. 10 illustrates an example of a package on package (PoP) integrated device that includes a redistribution layer.

FIG. 10 illustrates another example of a package on package (PoP) integrated device. As shown in FIG. 10, the integrated device 1000 includes a first package 1002 and a second package 1004. The first package 1002 includes a first substrate 1006, a first die (e.g., chip) 1008, a redistribution portion 1010, an encapsulation material 1012, a first set of solder balls 1016, a first set of interconnects 1018, and a first set of package interconnects 1028 (e.g., set of solder balls, pillars). The first substrate 1006 may include traces and/or vias (both of which are not shown).

The second package 1004 includes a second substrate 1005, a second die 1007, a third die 1009, a fourth die 1037, a fifth die 1039, a sixth die 1057, a seventh die 1059, a eighth die 1067, a ninth die 1069, a second set of solder balls 1015, a second set of interconnect 1017, a third set of interconnects 1019, a fourth set of interconnects 1047, and a fifth set of interconnects 1049. The second substrate 1005 may include traces and/or vias (both of which are not shown). The second package 1004 is positioned above the first package 1002.

As shown in FIG. 10, the sixth die 1057 is positioned on top (e.g., stacked) of the second die 1007, and the eight die 1067 is positioned on top (e.g., stacked) of the sixth die 1057. The seventh die 1059 is positioned on top (e.g., stacked) of the third die 1009, and the ninth die 1069 is positioned on top (e.g., stacked) of the seventh die 1059. In some implementations, the second die 1007, the third die 1009, the sixth die 1057, the seventh die 1059, the eight die 1067, and/or the ninth die 1069 is a memory die. In some implementations, the fourth die 1037 and/or the fifth die 1039 are memory controllers.

The second die 1007 includes a second set of through substrate vias (TSVs) 1077. The third die 1009 includes a third set of through substrate vias (TSVs) 1079. The sixth die 1057 includes a fourth set of through substrate vias (TSVs) 1087. The seventh die 1059 includes a fifth set of through substrate vias (TSVs) 1089.

The first die 1008 is coupled to a first surface (e.g., top surface) of the first substrate 1006 through the first set of interconnects 1018. Different implementations may use different interconnects. In some implementations, the first set of interconnects 1018 includes one of at least solder balls and/or bumps (e.g., copper pillars). The encapsulation material 1012 may encapsulate the first die 1008. Different implementations may use different materials for the encapsulation material 1012. In some implementations, the encapsulation material 1012 may include one of at least a mold, an epoxy, and/or a polymer fill. The first set of solder balls 1016 is coupled to a second surface (e.g., bottom surface) of the first substrate 1006. The first substrate 1006 includes a set of traces and/or vias that may electrically connect to the first die 1008 and/or the first set of solder balls 1016.

In some implementations, the second die 1007, the third die 1009, the fourth die 1037, and the fifth die 1039 are flip chips. In some implementations, the second die 1007, the third die 1009, the fourth die 1037, and the fifth die 1039 are memory dies. The second die 1007 and the third die 1009 are coupled to a first surface (e.g., top surface) of the second substrate 1005. The second die 1007 is electrically coupled to the traces and/or vias of the second substrate 1005 through the second set of interconnects 1017. In some implementations, the second set of interconnects 1017 includes one of at least solder balls and/or bumps (e.g., copper pillars). The third die 1009 is electrically coupled to the traces and/or vias of the second substrate 1005 through the third set of interconnects 1019. In some implementations, the third set of interconnects 1019 includes at least solder balls and/or bumps (e.g., copper pillars).

The fourth die 1037 and the fifth die 1039 are coupled to a second surface (e.g., bottom surface) of the second substrate 1005. The fourth die 1037 is electrically coupled to the traces and/or vias of the second substrate 1005 through the fourth set of interconnects 1047. In some implementations, the fourth set of interconnects 1047 includes one of at least solder balls and/or bumps (e.g., copper pillars). The fifth die 1039 is electrically coupled to the traces and/or vias of the second substrate 1005 through the fifth set of interconnects 1049. In some implementations, the fifth set of interconnects 1049 includes at least solder balls and/or bumps (e.g., copper pillars).

The second set of solder balls 1015 is coupled to the second surface (e.g., bottom surface) of the second substrate 1005. The second set of solder balls 1015 is also coupled to the redistribution portion 1010 of the first package 1002.

In some implementations, the redistribution portion 1010 includes a first pad, a passivation layer, a first insulation layer (e.g., first dielectric layer), a first redistribution layer, a second insulation layer (e.g., second dielectric layer), a second redistribution layer, a third insulation layer (e.g., third dielectric layer), and an under bump metallization (UBM) layer (e.g., similar to the redistribution portions 310, 410, 510, 610, 710). The redistribution layers are metal layers. Different implementations may have different numbers of redistribution layers (e.g., 1, 8 or more metal layers).

In some implementations, at least one of the second die 1007, the third die 1009, the fourth die 1037, the fifth die 1039, the sixth die 1057, the seventh die 1059, the eight die 1067, and/or the ninth die 1069 may be electrically coupled to the first die 1008. Different implementations may provide different electrical paths between the first die 1008, the second die 1007, the third die 1009, the fourth die 1037, the fifth die 1039, the sixth die 1057, the seventh die 1059, the eight die 1067, and/or the ninth die 1069.

In some implementations, the first die 1008 may be electrically coupled to at least one of the second die 1007, the third die 1009, the fourth die 1037, the fifth die 1039, the sixth die 1057, the seventh die 1059, the eight die 1067, and/or the ninth die 1069 through an electrical path that includes the first set of interconnects 1018, the substrate 1006 (e.g., traces and/or vias in the substrate), the first set of package interconnects 1028, the redistribution portion 1010 (e.g., pad, redistribution layers, UBM layer), the second set of solder balls 1015, the second substrate 1005 (e.g., traces and/or vias in the substrate), the second set of interconnects 1017, the third set of interconnects 1019, the fourth set of interconnects 1047, the fifth set of interconnects 1049, and/or the TSVs 1077, 1079, 1097, 1089.

In some implementations, the first set of package interconnects 1028 (e.g., solder balls, copper pillars) has a first pitch, and the second set of solder balls 1015 has a second pitch. In some implementations, the first pitch is equal or less than the second pitch.

Exemplary Package on Package (PoP) Integrated Device that Includes Stacked Dies

Figure 11:
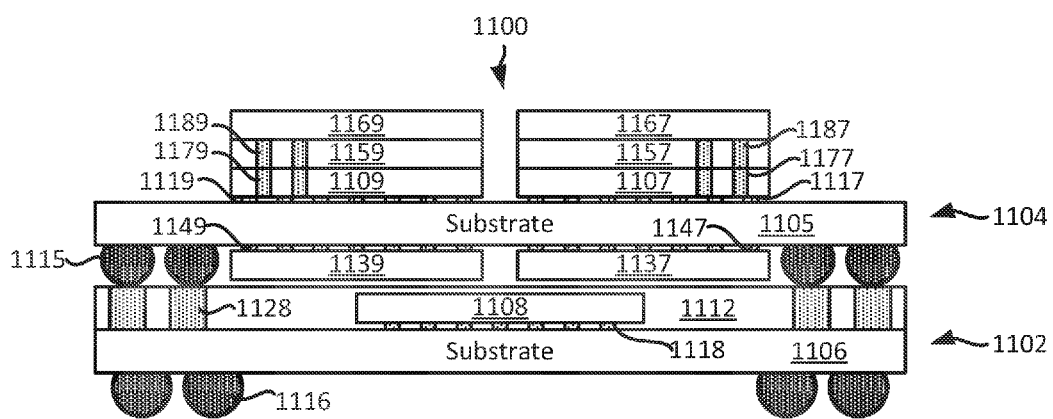
FIG. 11 illustrates an example of a package on package (PoP) integrated device.

FIG. 11 illustrates another example of a package on package (PoP) integrated device. As shown in FIG. 11, the integrated device 1100 includes a first package 1102 and a second package 1104. The first package 1102 includes a first substrate 1106, a first die (e.g., chip) 1108, an encapsulation material 1112, a first set of solder balls 1116, a first set of interconnects 1118, and a first set of package interconnects 1128 (e.g., copper pillar). The first substrate 1106 may include traces and/or vias (both of which are not shown).

The second package 1104 includes a second substrate 1105, a second die 1107, a third die 1109, a fourth die 1137, a fifth die 1139, a sixth die 1157, a seventh die 1159, a eighth die 1167, a ninth die 1169, a second set of solder balls 1115, a second set of interconnect 1117, a third set of interconnects 1119, a fourth set of interconnects 1147, and a fifth set of interconnects 1149. The second substrate 1105 may include traces and/or vias (both of which are not shown). The second package 1104 is positioned above the first package 1102.

As shown in FIG. 11, the sixth die 1157 is positioned on top (e.g., stacked) of the second die 1107, and the eight die 1167 is positioned on top (e.g., stacked) of the sixth die 1157. The seventh die 1159 is positioned on top (e.g., stacked) of the third die 1109, and the ninth die 1169 is positioned on top (e.g., stacked) of the seventh die 1159. In some implementations, the second die 1107, the third die 1109, the sixth die 1157, the seventh die 1159, the eight die 1167, and/or the ninth die 1169 is a memory die. In some implementations, the fourth die 1137 and/or the fifth die 1139 are memory controllers.

The second die 1107 includes a second set of through substrate vias (TSVs) 1177. The third die 1109 includes a third set of through substrate vias (TSVs) 1179. The sixth die 1157 includes a fourth set of through substrate vias (TSVs) 1187. The seventh die 1159 includes a fifth set of through substrate vias (TSVs) 1189.

The first die 1108 is coupled to a first surface (e.g., top surface) of the first substrate 1106 through the first set of interconnects 1118. Different implementations may use different interconnects. In some implementations, the first set of interconnects 1118 includes one of at least solder balls and/or bumps (e.g., copper pillars). The encapsulation material 1112 may encapsulate the first die 1108. Different implementations may use different materials for the encapsulation material 1112. In some implementations, the encapsulation material 1112 may include one of at least a mold, an epoxy, and/or a polymer fill. The first set of solder balls 1116 is coupled to a second surface (e.g., bottom surface) of the first substrate 1106. The first substrate 1106 includes a set of traces and/or vias that may electrically connect to the first die 1108 and/or the first set of solder balls 1116.

In some implementations, the second die 1107, the third die 1109, the fourth die 1137, and the fifth die 1139 are flip chips. In some implementations, the second die 1107, the third die 1109, the fourth die 1137, and the fifth die 1139 are memory dies. The second die 1107 and the third die 1109 are coupled to a first surface (e.g., top surface) of the second substrate 1105. The second die 1107 is electrically coupled to the traces and/or vias of the second substrate 1105 through the second set of interconnects 1117. In some implementations, the second set of interconnects 1117 includes one of at least solder balls and/or bumps (e.g., copper pillars). The third die 1109 is electrically coupled to the traces and/or vias of the second substrate 1105 through the third set of interconnects 1119. In some implementations, the third set of interconnects 1119 includes at least solder balls and/or bumps (e.g., copper pillars).

The fourth die 1137 and the fifth die 1139 are coupled to a second surface (e.g., bottom surface) of the second substrate 1105. The fourth die 1137 is electrically coupled to the traces and/or vias of the second substrate 1105 through the fourth set of interconnects 1147. In some implementations, the fourth set of interconnects 1147 includes one of at least solder balls and/or bumps (e.g., copper pillars). The fifth die 1139 is electrically coupled to the traces and/or vias of the second substrate 1105 through the fifth set of interconnects 1149. In some implementations, the fifth set of interconnects 1149 includes at least solder balls and/or bumps (e.g., copper pillars).

The second set of solder balls 1115 is coupled to the second surface (e.g., bottom surface) of the second substrate 1105. The second set of solder balls 1115 is also coupled to the first set of package interconnects 1128 (e.g., copper pillar) of the first package 1102.

In some implementations, at least one of the second die 1107, the third die 1109, the fourth die 1137, the fifth die 1139, the sixth die 1157, the seventh die 1159, the eight die 1167, and/or the ninth die 1169 may be electrically coupled to the first die 1108. Different implementations may provide different electrical paths between the first die 1108, the second die 1107, the third die 1109, the fourth die 1137, the fifth die 1139, the sixth die 1157, the seventh die 1159, the eight die 1167, and/or the ninth die 1169.

In some implementations, the first die 1108 may be electrically coupled to at least one of the second die 1107, the third die 1109, the fourth die 1137, the fifth die 1139, the sixth die 1157, the seventh die 1159, the eight die 1167, and/or the ninth die 1169 through an electrical path that includes the first set of interconnects 1118, the substrate 1106 (e.g., traces and/or vias in the substrate), the first set of package interconnects 1128, the second set of solder balls 1115, the second substrate 1105 (e.g., traces and/or vias in the substrate), the second set of interconnects 1117, the third set of interconnects 1119, the fourth set of interconnects 1147, the fifth set of interconnects 1149, and/or the TSVs 1177, 1179, 1197, 1189.

In some implementations, the first set of package interconnects 1128 (e.g., copper pillars) has a first pitch, and the second set of solder balls 1115 has a second pitch. In some implementations, the first pitch is equal or less than the second pitch.

Exemplary Package on Package (PoP) Integrated Device that Includes Stacked Dies

Figure 12:
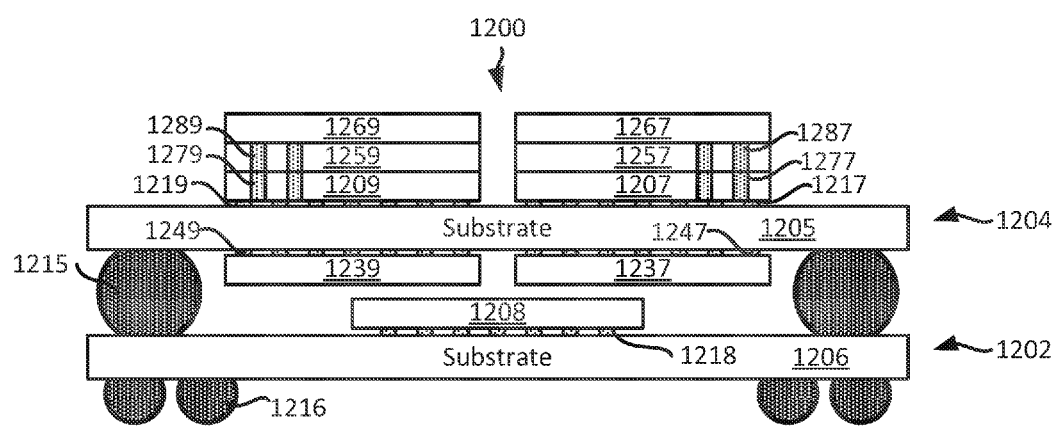
FIG. 12 illustrates an example of a package on package (PoP) integrated device.

FIG. 12 illustrates another example of a package on package (PoP) integrated device. As shown in FIG. 12, the integrated device 1200 includes a first package 1202 and a second package 1204. The first package 1202 includes a first substrate 1206, a first die (e.g., chip) 1208, a first set of solder balls 1216, a first set of interconnects 1218. The first substrate 1206 may include traces and/or vias (both of which are not shown).

The second package 1204 includes a second substrate 1205, a second die 1207, a third die 1209, a fourth die 1237, a fifth die 1239, a sixth die 1257, a seventh die 1259, a eighth die 1267, a ninth die 1269, a second set of solder balls 1215, a second set of interconnect 1217, a third set of interconnects 1219, a fourth set of interconnects 1247, and a fifth set of interconnects 1249. The second substrate 1205 may include traces and/or vias (both of which are not shown). The second package 1204 is positioned above the first package 1202.

As shown in FIG. 12, the sixth die 1257 is positioned on top (e.g., stacked) of the second die 1207, and the eight die 1267 is positioned on top (e.g., stacked) of the sixth die 1257. The seventh die 1259 is positioned on top (e.g., stacked) of the third die 1209, and the ninth die 1269 is positioned on top (e.g., stacked) of the seventh die 1259. In some implementations, the second die 1207, the third die 1209, the sixth die 1257, the seventh die 1259, the eight die 1267, and/or the ninth die 1269 is a memory die. In some implementations, the fourth die 1237 and/or the fifth die 1239 are memory controllers.

The second die 1207 includes a second set of through substrate vias (TSVs) 1277. The third die 1209 includes a third set of through substrate vias (TSVs) 1279. The sixth die 1257 includes a fourth set of through substrate vias (TSVs) 1287. The seventh die 1259 includes a fifth set of through substrate vias (TSVs) 1289.

The first die 1208 is coupled to a first surface (e.g., top surface) of the first substrate 1206 through the first set of interconnects 1218. Different implementations may use different interconnects. In some implementations, the first set of interconnects 1218 includes one of at least solder balls and/or bumps (e.g., copper pillars). The first set of solder balls 1216 is coupled to a second surface (e.g., bottom surface) of the first substrate 1206. The first substrate 1206 includes a set of traces and/or vias that may electrically connect to the first die 1208 and/or the first set of solder balls 1216.

In some implementations, the second die 1207, the third die 1209, the fourth die 1237, and the fifth die 1239 are flip chips. In some implementations, the second die 1207, the third die 1209, the fourth die 1237, and the fifth die 1239 are memory dies. The second die 1207 and the third die 1209 are coupled to a first surface (e.g., top surface) of the second substrate 1205. The second die 1207 is electrically coupled to the traces and/or vias of the second substrate 1205 through the second set of interconnects 1217. In some implementations, the second set of interconnects 1217 includes one of at least solder balls and/or bumps (e.g., copper pillars). The third die 1209 is electrically coupled to the traces and/or vias of the second substrate 1205 through the third set of interconnects 1219. In some implementations, the third set of interconnects 1219 includes at least solder balls and/or bumps (e.g., copper pillars).

The fourth die 1237 and the fifth die 1239 are coupled to a second surface (e.g., bottom surface) of the second substrate 1205. The fourth die 1237 is electrically coupled to the traces and/or vias of the second substrate 1205 through the fourth set of interconnects 1247. In some implementations, the fourth set of interconnects 1247 includes one of at least solder balls and/or bumps (e.g., copper pillars). The fifth die 1239 is electrically coupled to the traces and/or vias of the second substrate 1205 through the fifth set of interconnects 1249. In some implementations, the fifth set of interconnects 1249 includes at least solder balls and/or bumps (e.g., copper pillars).

The second set of solder balls 1215 is coupled to the second surface (e.g., bottom surface) of the second substrate 1205. The second set of solder balls 1215 is also coupled to the first surface (e.g., top surface) of the substrate 1206 of the first package 1202.

In some implementations, at least one of the second die 1207, the third die 1209, the fourth die 1237, the fifth die 1239, the sixth die 1257, the seventh die 1259, the eight die 1267, and/or the ninth die 1269 may be electrically coupled to the first die 1208. Different implementations may provide different electrical paths between the first die 1208, the second die 1207, the third die 1209, the fourth die 1237, the fifth die 1239, the sixth die 1257, the seventh die 1259, the eight die 1267, and/or the ninth die 1269.

In some implementations, the first die 1208 may be electrically coupled to at least one of the second die 1207, the third die 1209, the fourth die 1237, the fifth die 1239, the sixth die 1257, the seventh die 1259, the eight die 1267, and/or the ninth die 1269 through an electrical path that includes the first set of interconnects 1218, the substrate 1206 (e.g., traces and/or vias in the substrate), the second set of solder balls 1215, the second substrate 1205 (e.g., traces and/or vias in the substrate), the second set of interconnects 1217, the third set of interconnects 1219, the fourth set of interconnects 1247, the fifth set of interconnects 1249, and/or the TSVs 1277, 1279, 1297, 1289.

Exemplary Electrical Paths in Package on Package (PoP) Integrated Device

The present disclosure describes various package-on-package (PoP) integrated devices. These PoP integrated devices includes several dies (e.g., processor, memory) that are electrically coupled to each other. Different implementations may provide similar or different electrical paths between two or more dies of a PoP integrated devices. Examples of these electrical paths between two or more dies will be described below.

Figure 13:
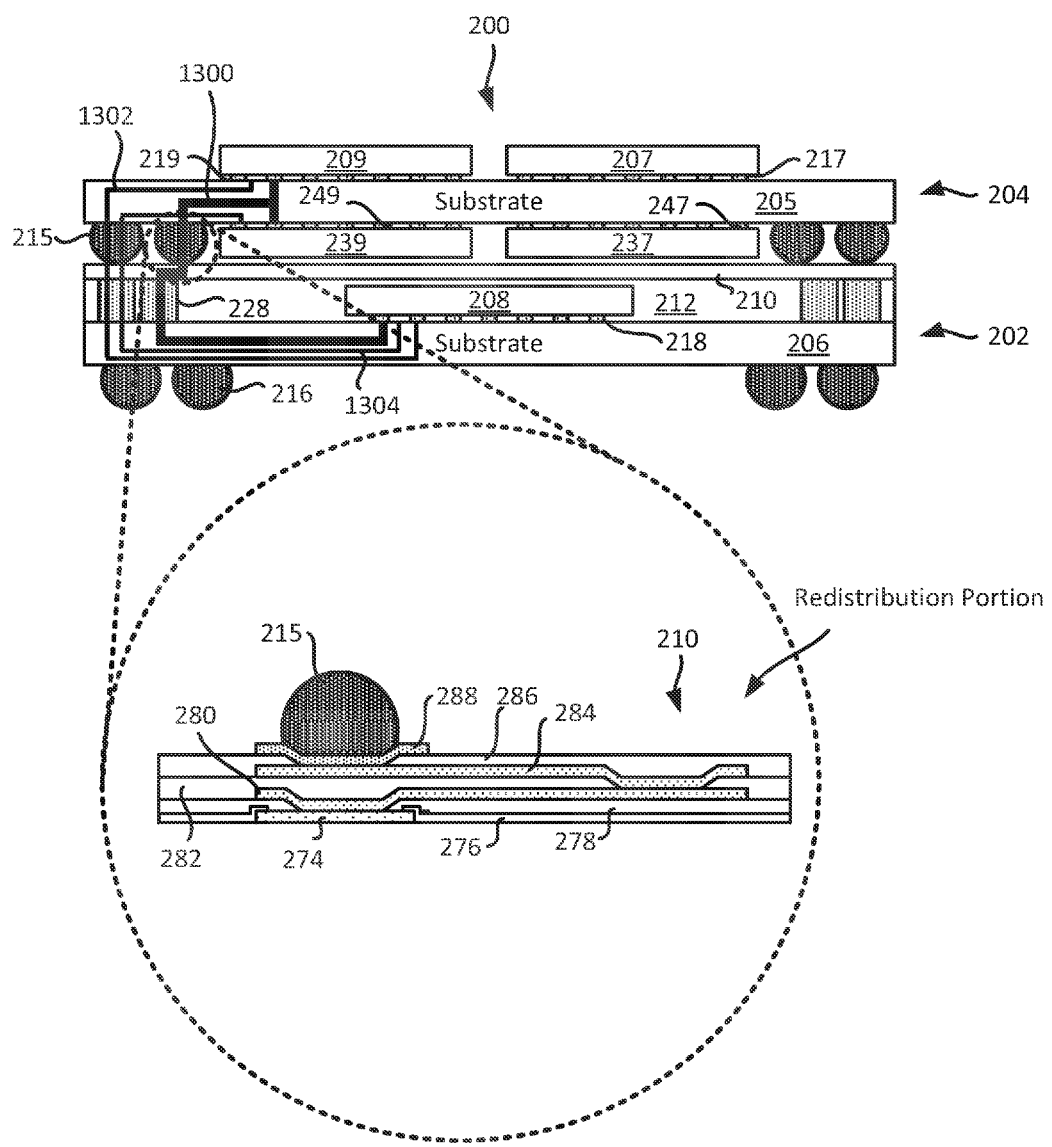
FIG. 13 illustrates examples of several electrical paths in a package on package (PoP) integrated device.

FIG. 13 illustrates the package on package (PoP) integrated device 200 of FIG. 2 with examples of several electrical paths between two or more dies.

In some implementations, the first die 208 may be electrically coupled to at least one of the second die 207, the third die 209, the fourth die 237, and the fifth die 239 through a first electrical path 1300 that includes the first set of interconnects 218, the substrate 206 (e.g., traces and/or vias in the substrate), the first set package interconnects 228, the redistribution portion 210 (e.g., pad, redistribution layers, UBM layer), the second set of solder balls 215, the second substrate 205 (e.g., traces and/or vias in the substrate), the second set of interconnects 217, the third set of interconnects 219, the fourth set of interconnects 247, and/or the fifth set of interconnects 249.

In some implementations, the first electrical path 1300 represents an electrical signal path between the first die 208 and at least one of the second die 207, the third die 209, the fourth die 237, and the fifth die 239. In some implementations, an electrical signal (e.g., data signal) from two or more dies may be combined before traversing to the first die 208. For example, a first signal (e.g., data signal) from the third die 209 and a second signal (e.g., data signal) the fifth die 239 may be combined (e.g., through a set of interconnects in the substrate 205) to form a third signal (e.g., data signal). The third signal may traverse the first electrical path 1300 to the first die 208. In some implementations, the first die 208 is a processor, and the second die 207, the third die 209, the fourth die 237, and the fifth die 239 are memory dies.

In some implementations, each of the memory dies (e.g., second die 207, third die 209, fourth die 237, fifth die 239) may each be separately electrically coupled to the first die 208 through a separate and respective electrical path that is different from the first electrical path 1300.

FIG. 13 illustrates a second electrical path 1302 and a third electrical path 1304. In some implementations, the first and second electrical paths 1302 and 1304 are control signal electrical paths.

The second electrical path 1302 electrically couples the first die 208 and the third die 209. In some implementations, the second electrical path 1302 includes the first set of interconnects 218, the substrate 206 (e.g., traces and/or vias in the substrate), the first set package interconnects 228, the redistribution portion 210 (e.g., pad, redistribution layers, UBM layer), the second set of solder balls 215, the second substrate 205 (e.g., traces and/or vias in the substrate), and/or the third set of interconnects 219.

In some implementations, the second electrical path 1302 provides an electrical path for one or more control signals from the first die 208 to the third die 209. In some implementations, the control signals from the first die 208 to the third die 209 provide instructions to the third die 209 on how to process information from a signal through the first electrical path 1300.

The third electrical path 1304 electrically couples the first die 208 and the fifth die 239. In some implementations, the third electrical path 1304 includes the first set of interconnects 218, the substrate 206 (e.g., traces and/or vias in the substrate), the first set package interconnects 228, the redistribution portion 210 (e.g., pad, redistribution layers, UBM layer), the second set of solder balls 215, the second substrate 205 (e.g., traces and/or vias in the substrate), and/or the fifth set of interconnects 249.

In some implementations, the third electrical path 1304 provides an electrical path for one or more control signals from the first die 208 to the fifth die 239. In some implementations, the control signals from the first die 208 to the fifth die 239 provide instructions to the fifth die 239 on how to process information from a signal through the first electrical path 1300.

It should be noted that the first electrical path 1300 is merely exemplary. In some implementations, the first electrical path 1300 may electrically couple the first die 208, the second die 207, and the third die 209.

Figure 14:
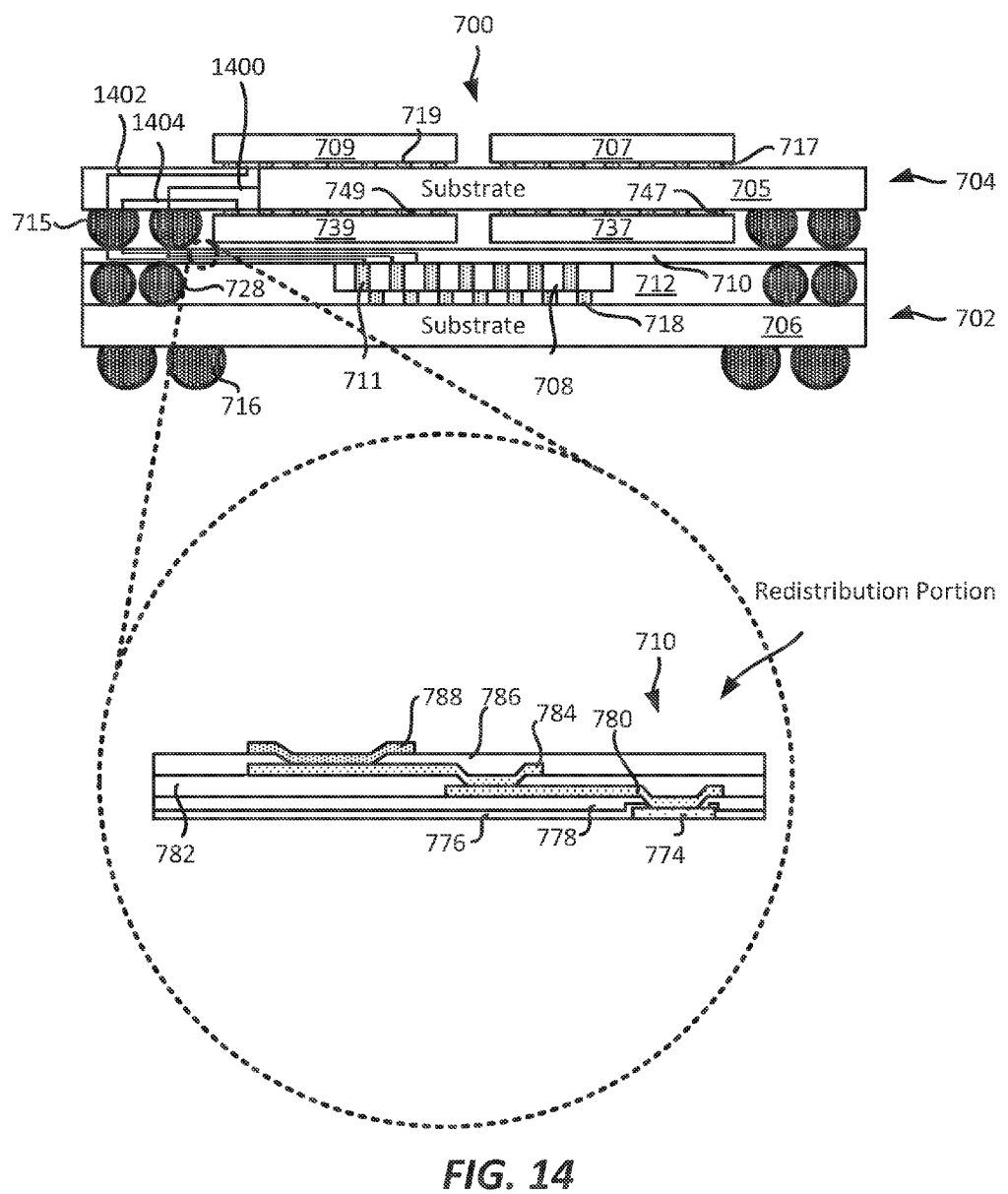
FIG. 14 illustrates examples of several electrical paths in a package on package (PoP) integrated device.

FIG. 14 illustrates the package on package (PoP) integrated device 700 of FIG. 7 with examples of several electrical paths between two or more dies.

In some implementations, the first die 708 may be electrically coupled to at least one of the second die 707, the third die 709, the fourth die 737, and the fifth die 739 through a first electrical path 1400 that includes the set of TSVs 711, the redistribution portion 710 (e.g., pad, redistribution layers, UBM layer), the second set of solder balls 715, the second substrate 705 (e.g., traces and/or vias in the substrate), the second set of interconnects 717, the third set of interconnects 719, the fourth set of interconnects 747, and/or the fifth set of interconnects 749. In some implementations, the first electrical path 1400 may bypass the substrate 706 and/or the first set of package interconnects 728.

In some implementations, the first electrical path 1400 represents an electrical signal path between the first die 708 and at least one of the second die 707, the third die 709, the fourth die 737, and the fifth die 739. In some implementations, an electrical signal (e.g., data signal) from two or more dies may be combined before traversing to the first die 708. For example, a first signal (e.g., data signal) from the third die 709 and a second signal (e.g., data signal) the fifth die 739 may be combined (e.g., through a set of interconnects in the substrate 705) to form a third signal (e.g., data signal). The third signal may traverse the first electrical path 1400 to the first die 708. In some implementations, the first die 708 is a processor, and the second die 707, the third die 709, the fourth die 737, and the fifth die 739 are memory dies.

In some implementations, each of the memory dies (e.g., second die 707, third die 709, fourth die 737, fifth die 739) may each be separately electrically coupled to the first die 708 through a separate and respective electrical path that is different from the first electrical path 1400.

FIG. 14 illustrates a second electrical path 1402 and a third electrical path 1404. In some implementations, the first and second electrical paths 1402 and 1404 are control signal electrical paths.

The second electrical path 1402 electrically couples the first die 708 and the third die 709. In some implementations, the second electrical path 1402 includes the set of TSVs 711, the redistribution portion 710 (e.g., pad, redistribution layers, UBM layer), the second set of solder balls 715, the second substrate 705 (e.g., traces and/or vias in the substrate), the second set of interconnects 717, and/or the third set of interconnects 719. In some implementations, the second electrical path 1402 may bypass the substrate 706 and/or the first set of package interconnects 728.

In some implementations, the second electrical path 1402 provides an electrical path for one or more control signals from the first die 708 to the third die 709. In some implementations, the control signals from the first die 708 to the third die 709 provide instructions to the third die 709 on how to process information from a signal through the first electrical path 1400.

The third electrical path 1404 electrically couples the first die 708 and the fifth die 739. In some implementations, the third electrical path 1404 includes the set of TSVs 711, the redistribution portion 710 (e.g., pad, redistribution layers, UBM layer), the second set of solder balls 715, the second substrate 705 (e.g., traces and/or vias in the substrate), and/or the fifth set of interconnects 749. In some implementations, the third electrical path 1404 may bypass the substrate 706 and/or the first set of package interconnects 728.

In some implementations, the third electrical path 1404 provides an electrical path for one or more control signals from the first die 708 to the fifth die 739. In some implementations, the control signals from the first die 708 to the fifth die 739 provide instructions to the fifth die 739 on how to process information from a signal through the first electrical path 1400.

It should be noted that the first electrical path 1400 is merely exemplary. In some implementations, the first electrical path 1400 may electrically couple the first die 708, the second die 707, and the third die 709.

Figure 15:
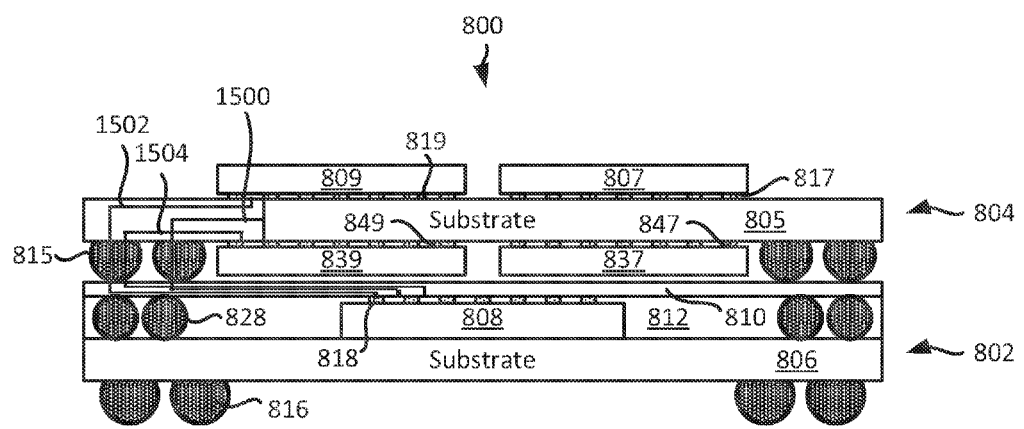
FIG. 15 illustrates examples of several electrical paths in a package on package (PoP) integrated device.

FIG. 15 illustrates the package on package (PoP) integrated device 800 of FIG. 8 with examples of several electrical paths between two or more dies.

In some implementations, the first die 808 may be electrically coupled to at least one of the second die 807, the third die 809, the fourth die 837, and the fifth die 839 through a first electrical path 1500 that includes the first set of interconnects 818, the redistribution portion 810 (e.g., pad, redistribution layers, UBM layer), the second set of solder balls 815, the second substrate 805 (e.g., traces and/or vias in the substrate), the second set of interconnects 817, the third set of interconnects 819, the fourth set of interconnects 847, and/or the fifth set of interconnects 849. In some implementations, the electrical path may bypass the substrate 806 and/or the first set of package interconnects 828.

In some implementations, the first electrical path 1500 represents an electrical signal path between the first die 808 and at least one of the second die 807, the third die 809, the fourth die 837, and the fifth die 839. In some implementations, an electrical signal (e.g., data signal) from two or more dies may be combined before traversing to the first die 808. For example, a first signal (e.g., data signal) from the third die 809 and a second signal (e.g., data signal) the fifth die 839 may be combined (e.g., through a set of interconnects in the substrate 805) to form a third signal (e.g., data signal). The third signal may traverse the first electrical path 1500 to the first die 808. In some implementations, the first die 808 is a processor, and the second die 807, the third die 809, the fourth die 837, and the fifth die 839 are memory dies.

In some implementations, each of the memory dies (e.g., second die 807, third die 809, fourth die 837, fifth die 839) may each be separately electrically coupled to the first die 808 through a separate and respective electrical path that is different from the first electrical path 1500.

FIG. 15 illustrates a second electrical path 1502 and a third electrical path 1504. In some implementations, the first and second electrical paths 1502 and 1504 are control signal electrical paths.

The second electrical path 1502 electrically couples the first die 808 and the third die 809. In some implementations, the second electrical path 1502 includes the first set of interconnects 818, the redistribution portion 810 (e.g., pad, redistribution layers, UBM layer), the second set of solder balls 815, the second substrate 805 (e.g., traces and/or vias in the substrate), and/or the third set of interconnects 819. In some implementations, the electrical path may bypass the substrate 806 and/or the first set of package interconnects 828.

In some implementations, the second electrical path 1502 provides an electrical path for one or more control signals from the first die 808 to the third die 809. In some implementations, the control signals from the first die 808 to the third die 809 provide instructions to the third die 809 on how to process information from a signal through the first electrical path 1500.

The third electrical path 1504 electrically couples the first die 808 and the fifth die 839. In some implementations, the third electrical path 1504 includes the first set of interconnects 818, the redistribution portion 810 (e.g., pad, redistribution layers, UBM layer), the second set of solder balls 815, the second substrate 805 (e.g., traces and/or vias in the substrate), and/or the fifth set of interconnects 849. In some implementations, the electrical path may bypass the substrate 806 and/or the first set of package interconnects 828.

In some implementations, the third electrical path 1504 provides an electrical path for one or more control signals from the first die 808 to the fifth die 839. In some implementations, the control signals from the first die 808 to the fifth die 839 provide instructions to the fifth die 839 on how to process information from a signal through the first electrical path 1500.

It should be noted that the first electrical path 1500 is merely exemplary. In some implementations, the first electrical path 1500 may electrically couple the first die 808, the second die 807, and the third die 809.

Figure 16:
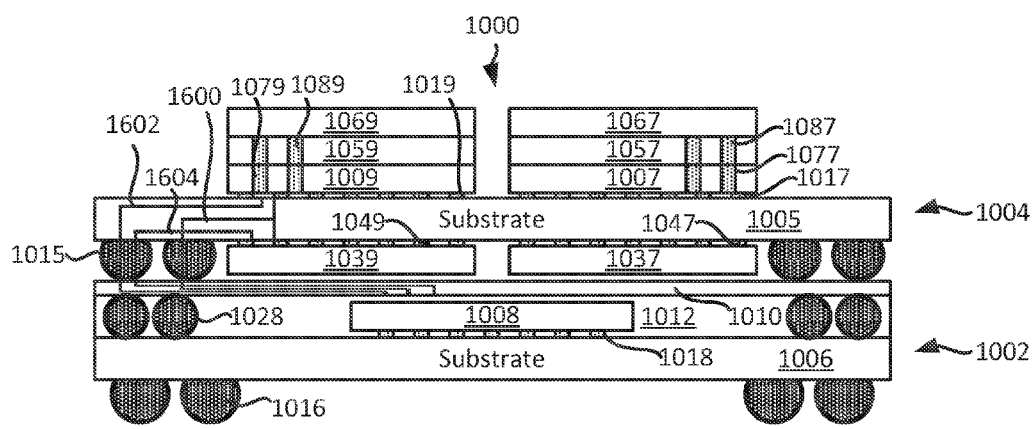
FIG. 16 illustrates examples of several electrical paths in a package on package (PoP) integrated device.

FIG. 16 illustrates the package on package (PoP) integrated device 1000 of FIG. 10 with examples of several electrical paths between two or more dies.

In some implementations, the first die 1008 may be electrically coupled to at least one of the second die 1007, the third die 1009, the fourth die 1037, the fifth die 1039, the sixth die 1057, the seventh die 1059, the eight die 1067, and/or the ninth die 1069 through an electrical path that includes the first set of interconnects 1018, the substrate 1006 (e.g., traces and/or vias in the substrate), the first set of package interconnects 1028, the redistribution portion 1010 (e.g., pad, redistribution layers, UBM layer), the second set of solder balls 1015, the second substrate 1005 (e.g., traces and/or vias in the substrate), the second set of interconnects 1017, the third set of interconnects 1019, the fourth set of interconnects 1047, the fifth set of interconnects 1049, and/or the TSVs 1077, 1079, 1097, 1089.

In some implementations, a first electrical path 1600 represents an electrical signal path between the first die 1008 and at least one of the second die 1007, the third die 1009, the fourth die 1037, and the fifth die 1039, the sixth die 1057, the seventh die 1059, the eight die 1067 and/or the ninth die 1069. In some implementations, an electrical signal (e.g., data signal) from two or more dies may be combined before traversing to the first die 1008. For example, a first signal (e.g., data signal) from the third die 1009 and a second signal (e.g., data signal) the fifth die 1039 may be combined (e.g., through a set of interconnects in the substrate 1005) to form a third signal (e.g., data signal). The third signal may traverse the first electrical path 1600 to the first die 1008. In some implementations, the first die 1008 is a processor, and the second die 1007, the third die 1009, the fourth die 1037, and the fifth die 1039 are memory dies.

In some implementations, each of the memory dies (e.g., second die 1007, third die 1009, fourth die 1037, fifth die 1039) may each be separately electrically coupled to the first die 1008 through a separate and respective electrical path that is different from the first electrical path 1600.

FIG. 16 illustrates a second electrical path 1602 and a third electrical path 1604. In some implementations, the first and second electrical paths 1602 and 1604 are control signal electrical paths.

The second electrical path 1602 electrically couples the first die 1008 and the third die 1009. In some implementations, the second electrical path 1602 includes the first set of interconnects 1018, the redistribution portion 1010 (e.g., pad, redistribution layers, UBM layer), the second set of solder balls 1015, the second substrate 1005 (e.g., traces and/or vias in the substrate), and/or the third set of interconnects 1019. In some implementations, the electrical path may bypass the substrate 1006 and/or the first set of package interconnects 1028.

In some implementations, the second electrical path 1602 provides an electrical path for one or more control signals from the first die 1008 to the third die 1009. In some implementations, the control signals from the first die 1008 to the third die 1009 provide instructions to the third die 1009 on how to process information from a signal through the first electrical path 1600.

The third electrical path 1604 electrically couples the first die 1008 and the fifth die 1039. In some implementations, the third electrical path 1604 includes the first set of interconnects 1018, the redistribution portion 1010 (e.g., pad, redistribution layers, UBM layer), the second set of solder balls 1015, the second substrate 1005 (e.g., traces and/or vias in the substrate), and/or the fifth set of interconnects 1049. In some implementations, the electrical path may bypass the substrate 1006 and/or the first set of package interconnects 1028.

In some implementations, the third electrical path 1604 provides an electrical path for one or more control signals from the first die 1008 to the fifth die 1039. In some implementations, the control signals from the first die 1008 to the fifth die 1039 provide instructions to the fifth die 1039 on how to process information from a signal through the first electrical path 1600.

It should be noted that the first electrical path 1600 is merely exemplary. In some implementations, the first electrical path 1600 may electrically couple the first die 1008, the second die 1007, and the third die 1009.

Figure 17:
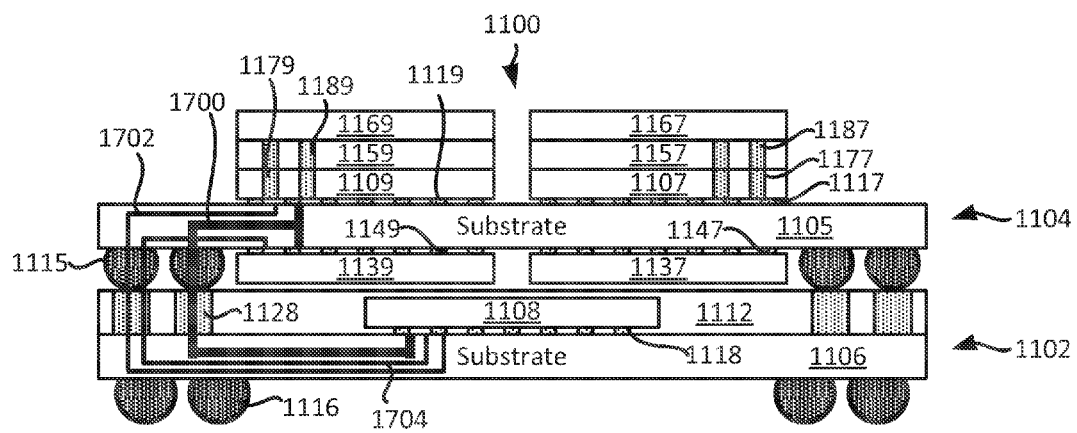
FIG. 17 illustrates examples of several electrical paths in a package on package (PoP) integrated device.

FIG. 17 illustrates the package on package (PoP) integrated device 1100 of FIG. 11 with examples of several electrical paths between two or more dies.

In some implementations, the first die 1108 may be electrically coupled to at least one of the second die 1107, the third die 1109, the fourth die 1137, the fifth die 1139, the sixth die 1157, the seventh die 1159, the eight die 1167, and/or the ninth die 1169 through an electrical path that includes the first set of interconnects 1118, the substrate 1106 (e.g., traces and/or vias in the substrate), the first set of package interconnects 1128, the second set of solder balls 1115, the second substrate 1105 (e.g., traces and/or vias in the substrate), the second set of interconnects 1117, the third set of interconnects 1119, the fourth set of interconnects 1147, the fifth set of interconnects 1149, and/or the TSVs 1177, 1179, 1197, 1189.

In some implementations, the first electrical path 1700 represents an electrical signal path between the first die 1108 and at least one of the second die 1107, the third die 1109, the fourth die 1137, and the fifth die 1139. In some implementations, an electrical signal (e.g., data signal) from two or more dies may be combined before traversing to the first die 1108. For example, a first signal (e.g., data signal) from the third die 1109 and a second signal (e.g., data signal) the fifth die 1139 may be combined (e.g., through a set of interconnects in the substrate 1105) to form a third signal (e.g., data signal). The third signal may traverse the first electrical path 1700 to the first die 1108. In some implementations, the first die 1108 is a processor, and the second die 1107, the third die 1109, the fourth die 1137, and the fifth die 1139 are memory dies.

In some implementations, each of the memory dies (e.g., second die 1107, third die 1109, fourth die 1137, fifth die 1139) may each be separately electrically coupled to the first die 1108 through a separate and respective electrical path that is different from the first electrical path 1700.

FIG. 17 illustrates a second electrical path 1702 and a third electrical path 1704. In some implementations, the first and second electrical paths 1702 and 1704 are control signal electrical paths.

The second electrical path 1702 electrically couples the first die 1108 and the third die 1109. In some implementations, the second electrical path 1702 includes the first set of interconnects 1118, the substrate 1106 (e.g., traces and/or vias in the substrate), the first set package interconnects 1128, the redistribution portion 1110 (e.g., pad, redistribution layers, UBM layer), the second set of solder balls 1115, the second substrate 1105 (e.g., traces and/or vias in the substrate), and/or the third set of interconnects 1119.

In some implementations, the second electrical path 1702 provides an electrical path for one or more control signals from the first die 1108 to the third die 1109. In some implementations, the control signals from the first die 1108 to the third die 1109 provide instructions to the third die 1109 on how to process information from a signal through the first electrical path 1700.

The third electrical path 1704 electrically couples the first die 1108 and the fifth die 1139. In some implementations, the third electrical path 1704 includes the first set of interconnects 1118, the substrate 1106 (e.g., traces and/or vias in the substrate), the first set package interconnects 1128, the redistribution portion 1110 (e.g., pad, redistribution layers, UBM layer), the second set of solder balls 1115, the second substrate 1105 (e.g., traces and/or vias in the substrate), and/or the fifth set of interconnects 1149.

In some implementations, the third electrical path 1704 provides an electrical path for one or more control signals from the first die 1108 to the fifth die 1139. In some implementations, the control signals from the first die 1108 to the fifth die 1139 provide instructions to the fifth die 1139 on how to process information from a signal through the first electrical path 1700.

It should be noted that the first electrical path 1700 is merely exemplary. In some implementations, the first electrical path 1700 may electrically couple the first die 1108, the second die 1107, and the third die 1109.

Exemplary Sequence for Providing/Fabricating a Package on Package (PoP) Integrated Device that Includes a Redistribution Portion In some implementations, providing/fabricating a package-on-package (PoP) integrated device that includes a redistribution portion includes several processes. FIG. 18 (which includes FIGS. 18A-18B) illustrates an exemplary sequence for providing/fabricating a package-on-package integrated device. In some implementations, the sequence of FIGS. 18A-18B may be used to provide/manufacture the PoP integrated device of FIGS. 2, 3, 6, 7, 8, 10, 11, and/or 12, and/or other PoP integrated devices described in the present disclosure. However, for the purpose of simplification, FIGS. 18A-18B will be described in the context of providing/fabricating the PoP integrated device of FIG. 2.

It should be noted that the sequence of FIGS. 18A-18B may combine one or more stages in order to simplify and/or clarify the sequence for providing a PoP integrated device.

As shown at stage 1 of FIG. 18A, a substrate (e.g., substrate 206) is provided. In some implementations, providing the substrate 206 may include fabricating (e.g., forming) the substrate 206 and/or receiving the substrate from a supplier. In some implementations, the substrate 206 may includes a set of interconnects (e.g., traces, vias).

At stage 2, a first die 208 is coupled to a first surface (e.g., top surface) of the first substrate 206 through the first set of interconnects 218. Different implementations may use different interconnects. In some implementations, the first set of interconnects 218 includes one of at least solder balls and/or bumps (e.g., copper pillars).

At stage 3, an encapsulation material (e.g., the encapsulation material 212) is provided such that it may encapsulate the first die 208. Different implementations may use different materials for the encapsulation material 212. In some implementations, the encapsulation material 212 may include one of at least a mold, an epoxy, and/or a polymer fill.

At stage 4, at least one cavity (e.g., cavity 227) is formed in the encapsulation material 212. Different implementations may use different materials for forming the cavity. In some implementations, a laser is used to form the cavity. In some implementations, one or more cavities may be formed using a photo-etching process.

At stage 5, one or more the cavities are filled with a conductive material to define interconnects in the encapsulation material 212. In some implementations, the interconnects are through mold vias and/or package interconnects 228. Different implementations may use different materials for the package interconnects 228. In some implementations, the package interconnects 228 is a plated conducting material. In some implementations, the package interconnects 228 is a solder ball.

As shown in stage 6 of FIG. 18B, a redistribution portion 210 is formed on the encapsulation material 212. In some implementations, the redistribution portion 210 may include a first pad, a passivation layer, a first insulation layer (e.g., first dielectric layer), a first redistribution layer, a second insulation layer (e.g., second dielectric layer), a second redistribution layer, a third insulation layer (e.g., third dielectric layer), and/or an under bump metallization (UBM) layer, as described in FIG. 2. An example of providing/fabricating a redistribution portion 210 is further described in detail in FIG. 19A-19C. In some implementations, stage 6 represents a first package (e.g., package 202) in a package-on-package (PoP) integrated device.

At stage 7, a second package (e.g., second package 204) is provided (e.g., fabricated) for the PoP integrated device. The second package includes the second substrate 205, the second die 207, the third die 209, the fourth die 237, the fifth die 239, the second set of solder balls 215, the second set of interconnect 217, the third set of interconnects 219, the fourth set of interconnects 247, and/or the fifth set of interconnects 249. The second substrate 205 may include traces and/or vias (both of which are not shown).

At stage 8, the second package 204 is coupled (e.g., positioned above) to the first package (e.g., first package 202). In addition, the first set of solder balls 216 is coupled to a second surface (e.g., bottom surface) of the first substrate 206. The first substrate 206 includes a set of traces and/or vias that may electrically connect to the first die 208 and/or the first set of solder balls 216.

In some implementations, the second die 207, the third die 209, the fourth die 237, and the fifth die 239 are flip chips. In some implementations, the second die 207, the third die 209, the fourth die 237, and the fifth die 239 are memory dies. The second die 207 and the third die 209 are coupled to a first surface (e.g., top surface) of the second substrate 205. The second die 207 is electrically coupled to the traces and/or vias of the second substrate 205 through the second set of interconnects 217. In some implementations, the second set of interconnects 217 includes one of at least solder balls and/or bumps (e.g., copper pillars). The third die 209 is electrically coupled to the traces and/or vias of the second substrate 205 through the third set of interconnects 219. In some implementations, the third set of interconnects 219 includes at least solder balls and/or bumps (e.g., copper pillars).

The fourth die 237 and the fifth die 239 are coupled to a second surface (e.g., bottom surface) of the second substrate 205. The fourth die 237 is electrically coupled to the traces and/or vias of the second substrate 205 through the fourth set of interconnects 247. In some implementations, the fourth set of interconnects 247 includes one of at least solder balls and/or bumps (e.g., copper pillars). The fifth die 239 is electrically coupled to the traces and/or vias of the second substrate 205 through the fifth set of interconnects 249. In some implementations, the fifth set of interconnects 249 includes at least solder balls and/or bumps (e.g., copper pillars).

The second set of solder balls 215 is coupled to the second surface (e.g., bottom surface) of the second substrate 205. The second set of solder balls 215 is also coupled to the redistribution portion 210 of the first package 202.

Exemplary Sequence for Providing/Fabricating a Redistribution Portion in Package-on-Package (PoP) Integrated Device In some implementations, providing/fabricating a redistribution portion includes several processes. FIG. 19 (which includes FIGS. 19A-19C) illustrates an exemplary sequence for fabricating a redistribution portion for any of the packages and/or integrated device described in the present disclosure.

As shown in stage 1 of FIG. 19A, a substrate (e.g., substrate 1901) is provided (e.g., formed). In some implementations, the substrate is a laminate substrate. Different implementations may use different materials for the substrate (e.g., dielectric). The substrate may include one or more dies that are coupled to a surface of the substrate. The substrate may include interconnects (e.g., traces and/or vias).

At stage 2, an encapsulation layer (e.g., encapsulation layer 1902) is provided (e.g., formed) on the substrate. Different implementations may provide different materials for the encapsulation layer (e.g., mold, epoxy). Stage 2 also illustrates that an interconnect 1903 is formed in the encapsulation layer 1902. The interconnect 1903 (e.g., through encapsulation via) may be formed in the encapsulation layer 1902 after a cavity was formed in the encapsulation layer 1902. Different implementations may use different materials for the interconnect 1903. In some implementations, the interconnects 1903 is a plated conducting material. In some implementations, the interconnects 1903 is a solder ball. In some implementations, the interconnect 1903 is a package interconnect.

At stage 3, at least one pad (e.g., pad 1904) is provided on the interconnect 1903. In some implementations, the pad is coupled to the interconnect 1903. In some implementations, the pad 1904 is an aluminum pad. However, different implementations may use different materials for the pad 1904. Different implementations may use different processes for providing the pad on the lower level metal and dielectric layers 1902. For example, in some implementations, a lithography and/or etching process may be use to provide the pad 1904.

At stage 4, a passivation layer (e.g., passivation layer 1906) is provided on the lower level metal and dielectric layers 1902. Different implementations may use different materials for the passivation layer. As shown in stage 4, the passivation layer 406 is provided on the lower level metal and dielectric layers 1902 such that at least a portion of the pad 1904 is exposed.

At stage 5 of FIG. 19B, a first insulation layer (e.g., first insulation layer 1908) is provided on the passivation layer 1906 and the pad 1904. Different implementations may use different materials for the first insulation layer 1908. For example, the first insulation layer 1908 may be a Polybenzoxazole (PbO) layer or a polymer layer.

At stage 6, a cavity (e.g., cavity 1909) is provided/created in the first insulation layer 1908. As further shown in stage 6, the cavity 1909 is created over the pad 1904. Different implementations may create the cavity 1909 differently. For example, the cavity 1909 may be provided/created by etching the first insulation layer 1908.

At stage 7, a first metal redistribution layer is provided. Specifically, a first metal redistribution layer 1910 is provided over the pad 1904 and the first insulation layer 1908. As shown in stage 7, the first metal redistribution layer 1910 is coupled to the pad 1904. In some implementations, the first metal redistribution layer 1910 is a copper layer.

At stage 8 of FIG. 19C, a second insulation layer (e.g., second insulation layer 1912) is provided on the first insulation layer 1908 and the first metal redistribution layer 1910. Different implementations may use different materials for the second insulation layer 1912. For example, the second insulation layer 1912 may be a Polybenzoxazole (PbO) layer or a polymer layer.

At stage 9, a cavity (e.g., cavity 1913) is provided/created in the second insulation layer 1912. Different implementations may create the cavity 1913 differently. For example, the cavity 1913 may be provided/created by etching the second insulation layer 1912.

At stage 10, an under bump metallization (UBM) layer is provided. Specifically, an under bump metallization (UBM) layer 1914 is provided in the cavity 1913 of the second insulation layer 1912. As shown at stage 10, the UBM layer 1914 is coupled to the first metal redistribution layer 1910. In some implementations, the UBM layer 1914 is a copper layer. In some implementations, stage 10 is a representation of a redistribution portion for a package-on-package (PoP) integrated device.

Exemplary Electronic Devices

FIG. 20 illustrates various electronic devices that may be integrated with any of the aforementioned integrated device, semiconductor device, integrated circuit, die, interposer, package or package-on-package (PoP). For example, a mobile telephone 2002, a laptop computer 2004, and a fixed location terminal 2006 may include an integrated device 2000 as described herein. The integrated device 2000 may be, for example, any of the integrated circuits, dice, packages, package-on-packages described herein. The devices 2002, 2004, 2006 illustrated in FIG. 20 are merely exemplary. Other electronic devices may also feature the integrated device 2000 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14, 15, 16, 17, 18A-18B, 19A-19C and/or 20 may be rearranged and/or combined into a single component, step, feature or function or embodied in several components, steps, or functions. Additional elements, components, steps, and/or functions may also be added without departing from the invention. It should also be noted that FIGS. 2, 3, 4, 5, 6, 7, 8, 9, 10, 11, 12, 13, 14, 15, 16, 17, 18A-18B, 19A-19C and/or 20 and its corresponding description in the present disclosure is not limited to dies and/or ICs. In some implementations, FIGS. 2, 3, 4, 5, 6, 7, 8, 9, 10, 11, 12, 13, 14, 15, 16, 17, 18A-18B, 19A-19C and/or 20 and its corresponding description may be used to manufacture, create, provide, and/or produce integrated devices. In some implementations, an integrated device may include a die, a die package, an integrated circuit (IC), a wafer, a semiconductor device, a package on package, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a first package comprising:
      a first substrate comprising a first surface and a second surface;
      a first die coupled to the first surface of the first substrate; and
      a redistribution portion comprising at least one redistribution layer;
   a first set of interconnects coupled to the redistribution portion of the first package; and
   a second package coupled to the first package through the first set of interconnects, the second package comprising:
      a second substrate comprising a first surface and a second surface; and
      a second die coupled to the first surface of the second substrate, wherein the second die is electrically coupled to the first die through at least the second substrate of the second package, the first set of interconnects, and the redistribution portion of the first package;
      wherein the second package further comprises a third die coupled to the second surface of the second substrate.

2. The integrated device of claim 1, wherein the third die is electrically coupled to the first die through at least the second substrate of the second package, the first set of interconnects, and the redistribution portion of the first package.

3. The integrated device of claim 1, wherein the second die and the third die are electrically coupled to the first die through a first electrical path that includes a combined electrical signal from the second die and the third die.

4. The integrated device of claim 3, wherein the second die is coupled to the first die through a second electrical path that provides a control signal from the first die to the second die.

5. The integrated device of claim 1, wherein the second package further comprises a fourth die stacked on the second die, the second die comprising a plurality of through substrate vias (TSVs).

6. The integrated device of claim 5, wherein the fourth die is electrically coupled to the first die through at least the plurality of TSVs, the second substrate of the second package, the first set of interconnects, and the redistribution portion of the first package.

7. The integrated device of claim 1, wherein the first set of interconnects includes at least one of a solder ball and/or a bump.

8. The integrated device of claim 1, wherein the second die is one of at least a flip chip and/or a memory die.

9. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

10. An apparatus comprising:
    a first package comprising:
       a first substrate comprising a first surface and a second surface;
       a first die coupled to the first surface of the first substrate; and
       a redistribution means configured to provide an electrical path for an electrical signal;
    a first set of interconnects coupled to the redistribution means of the first package; and
    a second package coupled to the first package through the first set of interconnects, the second package comprising:
       a second substrate comprising a first surface and a second surface; and
       a second die coupled to the first surface of the second substrate, wherein the second die is electrically coupled to the first die through at least the second substrate of the second package, the first set of interconnects, and the redistribution means of the first package;
       wherein the second package further comprises a third die coupled to the second surface of the second substrate.

11. The apparatus of claim 10, wherein the third die is electrically coupled to the first die through at least the second substrate of the second package, the first set of interconnects, and the redistribution means of the first package.

12. The apparatus of claim 10, wherein the second die and the third die are electrically coupled to the first die through a first electrical path that includes a combined electrical signal from the second die and the third die.

13. The apparatus of claim 12, wherein the second die is coupled to the first die through a second electrical path that provides a control signal from the first die to the second die.

14. The apparatus of claim 10, wherein the second package further comprises a fourth die stacked on the second die, the second die comprising a plurality of through substrate vias (TSVs).

15. The apparatus of claim 14, wherein the fourth die is electrically coupled to the first die through at least the plurality of TSVs, the second substrate of the second package, the first set of interconnects, and the redistribution means of the first package.

16. The apparatus of claim 10, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

17. An integrated device comprising:
    a first package comprising:
       a first substrate comprising a first surface and a second surface;
       a first die coupled to the first surface of the first substrate; and
       a redistribution portion comprising at least one redistribution layer;
    a first set of interconnects coupled to the redistribution portion of the first package; and
    a second package coupled to the first package through the first set of interconnects, the second package comprising:
       a second substrate comprising a first surface and a second surface; and
       a second die coupled to the first surface of the second substrate, wherein the second die is electrically coupled to the first die through at least the second substrate of the second package, the first set of interconnects, the redistribution portion of the first package, a second set of interconnects in the first package, and the first substrate of the first package.

18. A method for fabricating a package on package (PoP) integrated device, comprising:
  providing a first package including a first substrate comprising a first surface and a second surface, the first package further including a first die coupled to the first surface of the first substrate and a redistribution portion comprising at least one redistribution layer;
  coupling a first set of interconnects to the redistribution portion of the first package;
  providing a second package including a second substrate comprising a first surface and a second surface, the second package further including a second die coupled to the first surface of the second substrate and a third die coupled to the second surface of the second substrate;
  coupling the second package to the first package through the first set of interconnects; and
  electrically coupling the second die to the first die through at least the second substrate of the second package, the first set of interconnects, and the redistribution portion of the first package.

19. A method for fabricating a package on package (PoP) integrated device, comprising:
  providing a first package including a first substrate comprising a first surface and a second surface, the first package further including a first die coupled to the first surface of the first substrate, a first set of interconnects and a redistribution portion comprising at least one redistribution layer;
  coupling a second set of interconnects to the redistribution portion of the first package;
  providing a second package including a second substrate comprising a first surface and a second surface, the second package further including a second die coupled to the first surface of the second substrate;
  coupling the second package to the first package through the second set of interconnects; and
  electrically coupling the second die to the first die through at least the second substrate of the second package, the second set of interconnects, the redistribution portion of the first package, the first set of interconnects in the first package, and the first substrate of the first package.

* * * * *